(12) United States Patent
Shimizu et al.

(10) Patent No.: US 10,177,251 B2
(45) Date of Patent: Jan. 8, 2019

(54) SEMICONDUCTOR DEVICE, INVERTER CIRCUIT, DRIVE DEVICE, VEHICLE, AND ELEVATOR

(71) Applicant: Kabushiki Kaisha Toshiba, Minato-ku (JP)

(72) Inventors: Tatsuo Shimizu, Shinagawa (JP); Takashi Shinohe, Yokosuka (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/891,935

(22) Filed: Feb. 8, 2018

(65) Prior Publication Data

US 2018/0337275 A1  Nov. 22, 2018

(30) Foreign Application Priority Data

May 22, 2017  (JP) ................................. 2017-100824

(51) Int. Cl.
*H01L 29/78*   (2006.01)
*H01L 29/423*  (2006.01)
(Continued)

(52) U.S. Cl.
CPC ...... *H01L 29/7813* (2013.01); *H01L 29/0623* (2013.01); *H01L 29/0696* (2013.01); *H01L 29/0865* (2013.01); *H01L 29/1095* (2013.01); *H01L 29/1608* (2013.01); *H01L 29/36* (2013.01); *H01L 29/41741* (2013.01); *H01L 29/4236* (2013.01); *H01L 29/4916* (2013.01); *H01L 29/7806* (2013.01)

(58) Field of Classification Search
None
See application file for complete search history.

(56) References Cited

U.S. PATENT DOCUMENTS 9,679,971 B2   6/2017  Shimizu et al.
9,887,287 B1*  2/2018  Lichtenwalner ...... H01L 27/088
(Continued)

FOREIGN PATENT DOCUMENTS

JP  2015-226060   12/2015
JP  2015-228496   12/2015
(Continued)

*Primary Examiner* — Joseph Schoenholtz
(74) *Attorney, Agent, or Firm* — Oblon, McClelland, Maier & Neustadt, L.L.P.

(57) ABSTRACT

A semiconductor device according to an embodiment includes a silicon carbide layer having a first plane and a second plane; a source electrode; a drain electrode; first and second gate electrodes located; an n-type drift region and a p-type body region; n-type first and second source regions; a p-type first silicon carbide region and p-type second silicon carbide region having a p-type impurity concentration higher than the body region; first and second gate insulating layers; a p-type third silicon carbide region contacting the first silicon carbide region, a first n-type portion being located between the first gate insulating layer and the third silicon carbide region; and a p-type fourth silicon carbide region contacting the second silicon carbide region, a second n-type portion being located between the second gate insulating layer and the fourth silicon carbide region.

20 Claims, 20 Drawing Sheets

(51) Int. Cl.
  *H01L 29/06*   (2006.01)
  *H01L 29/10*   (2006.01)
  *H01L 29/16*   (2006.01)
  *H01L 29/417*  (2006.01)
  *H01L 29/08*   (2006.01)
  *H01L 29/36*   (2006.01)
  *H01L 29/49*   (2006.01)

(56) References Cited

U.S. PATENT DOCUMENTS

| | | |
|---|---|---|
| 2013/0001592 A1* | 1/2013 | Miyahara ............ H01L 29/4236 257/77 |
| 2015/0340487 A1 | 11/2015 | Siemieniec et al. |
| 2016/0163852 A1 | 6/2016 | Siemieniec et al. |
| 2016/0181408 A1* | 6/2016 | Aichinger ....... H01L 21/823462 257/77 |
| 2017/0077239 A1 | 3/2017 | Shimizu et al. |
| 2017/0345905 A1* | 11/2017 | Siemieniec ............. H01L 29/04 |

FOREIGN PATENT DOCUMENTS

| | | |
|---|---|---|
| JP | 2016-122835 | 7/2016 |
| JP | 2017-55000 | 3/2017 |

* cited by examiner

… (1)

SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2017-100824, filed on May 22, 2017, the entire contents of which are incorporated herein by reference.

FIELD

Embodiments described herein relate generally to a semiconductor device, an inverter circuit, a drive device, a vehicle, and an elevator.

BACKGROUND

Silicon carbide is expected as a material for next-generation semiconductor devices. As compared with silicon, the silicon carbide has superior physical properties such as a threefold band gap, approximately tenfold breakdown field strength, and approximately threefold thermal conductivity. By using these characteristics, a semiconductor device in which low loss and a high-temperature operation can be realized.

As a structure for reducing on-resistance of a metal oxide semiconductor field effect transistor (MOSFET) using the silicon carbide, there is a trench gate type MOSFET in which a gate electrode is provided in a trench. In the case where load short circuiting occurs at the output side of the trench gate type MOSFET, because the on-resistance is low, time until an excessive current flows and breakdown occurs may be shortened. That is, a short circuit tolerance may decrease.

DETAILED DESCRIPTION

Figure 1:
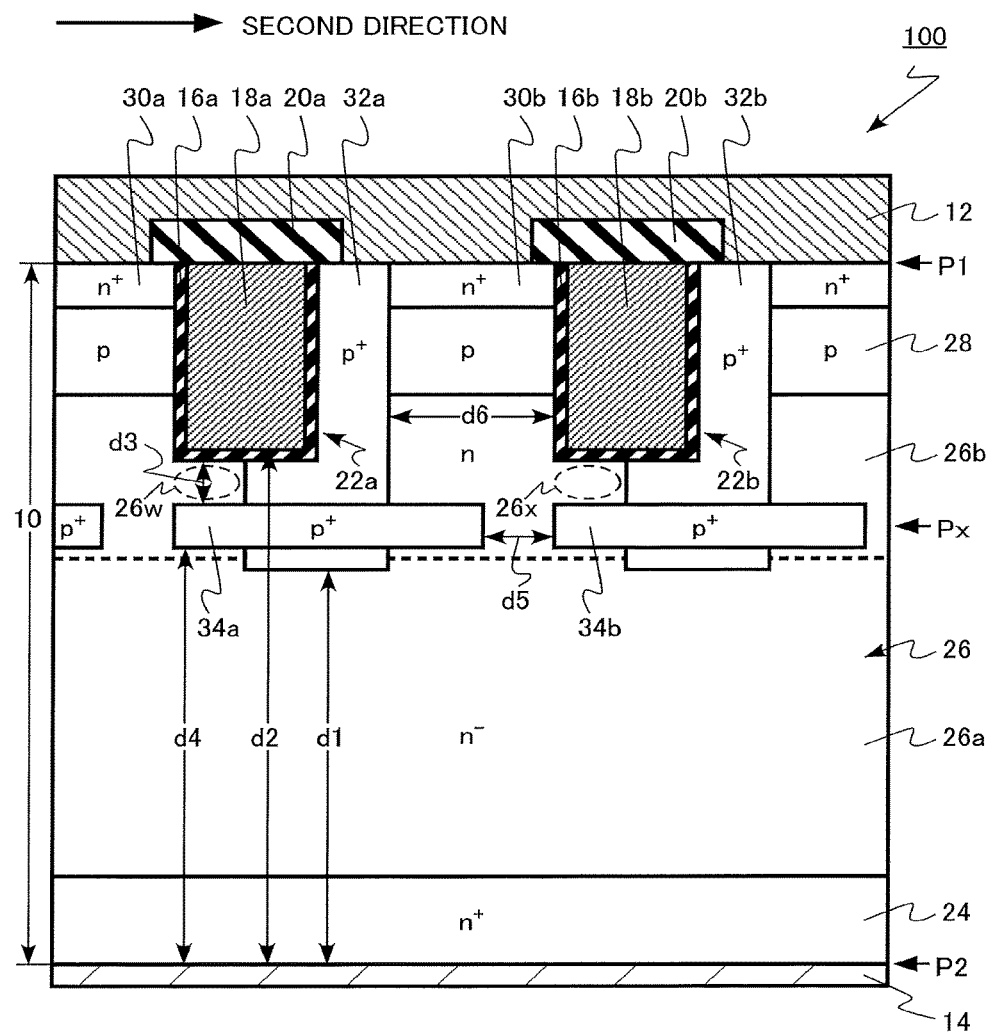
FIG. 1 is a schematic cross-sectional view of a semiconductor device according to a first embodiment.

A semiconductor device includes: a silicon carbide layer having a first plane and a second plane; a source electrode contacting the first plane; a drain electrode contacting the second plane; a first gate electrode located between the source electrode and the drain electrode; a second gate electrode located between the source electrode and the drain electrode; an n-type drift region located in the silicon carbide layer, the n-type drift region including a first n-type portion and a second n-type portion; a p-type body region located in the silicon carbide layer and located between the n-type drift region and the first plane; an n-type first source region located in the silicon carbide layer, the n-type first source region located between the p-type body region and the first plane, and the n-type first source region contacting the source electrode; an n-type second source region located in the silicon carbide layer, the n-type second source region located between the p-type body region and the first plane, the n-type second source region contacting the source electrode, and the first gate electrode being located between the n-type first source region and the n-type second source region; a p-type first silicon carbide region located in the silicon carbide layer, the p-type first silicon carbide region located between the n-type drift region and the first plane, the p-type first silicon carbide region contacting the source electrode, a distance between the second plane and the p-type first silicon carbide region being smaller than a distance between the second plane and the first gate electrode, the first gate electrode being located between the n-type first source region and the p-type first silicon carbide region, the p-type first silicon carbide region located between the first gate electrode and the p-type body region, and the p-type first silicon carbide region having a p-type impurity concentration higher than a p-type impurity concentration of the p-type body region; a p-type second silicon carbide region located in the silicon carbide layer, the p-type second silicon carbide region located between the n-type drift region and the first plane, the p-type second silicon carbide region contacting the source electrode, a distance between the second plane and the p-type second silicon carbide region being smaller than a distance between the second plane and the second gate electrode, the second gate electrode being located between the n-type second source region and the p-type second silicon carbide region, the p-type second silicon carbide region located between the second gate electrode and the p-type body region, and the p-type second silicon carbide region having a p-type impurity concentration higher than the p-type impurity concentration of the p-type body region; a first gate insulating layer located between the first gate electrode and the n-type drift region, between the first gate electrode and the p-type body region, between the first gate electrode and the p-type first silicon carbide region, and between the first gate electrode and the n-type first source region; a second gate insulating layer located between the second gate electrode and the n-type drift region, between the second gate electrode and the p-type body region, between the second gate electrode and the p-type second silicon carbide region, and between the second gate electrode and the n-type second source region; a p-type third silicon carbide region located in the silicon carbide layer, the p-type third silicon carbide region located between the second plane and the first gate electrode, the p-type third silicon carbide region contacting the p-type first silicon carbide region, the first n-type portion being located between the first gate insulating layer and the p-type third silicon carbide region; and a p-type fourth silicon carbide region located in the silicon carbide layer, the p-type fourth silicon carbide region located between the second plane and the second gate electrode, the p-type fourth silicon carbide region contacting the p-type second silicon carbide region, the second n-type portion being located between the second gate insulating layer and the p-type fourth silicon carbide region, and the p-type fourth silicon carbide region separated from the p-type third silicon carbide region.

Hereinafter, embodiments of the present disclosure will be described with reference to the drawings. In the following description, the same or similar members are denoted by the same reference numerals and the description of the members described once is appropriately omitted.

In addition, in the following description, notations $n^-$, n, $n^-$, p, and $p^-$ represent the relative magnitudes of impurity concentrations in respective conductive types. That is, an n-type impurity concentration of $n^+$ is relatively higher than an n-type impurity concentration of n and an n-type impurity concentration of $n^-$ is relatively lower than the n-type impurity concentration of n. In addition, a p-type impurity concentration of $p^+$ is relatively higher than a p-type impurity concentration of p and a p-type impurity concentration of $p^-$ is relatively lower than the p-type impurity concentration of p. The type and the $n^-$ type may be simply described as the n types and the $p^+$ type and the $p^-$ type may be simply described as the p types.

The impurity concentration can be measured by secondary ion mass spectrometry (SIMS), for example. In addition, the relative magnitude of the impurity concentration can be determined from the magnitude of a carrier concentration obtained by scanning capacitance microscopy (SCM), for example. In addition, a distance such as a depth of an impurity region can be obtained by SIMS, for example. In addition, the distance such as the depth of the impurity region can be obtained from a combined image of an SCM image and an atomic force microscope (AFM) image, for example.

First Embodiment

A semiconductor device according to this embodiment includes: a silicon carbide layer having a first plane and a second plane; a source electrode contacting the first plane; a drain electrode contacting the second plane; a first gate electrode located between the source electrode and the drain electrode; a second gate electrode located between the source electrode and the drain electrode; an n-type drift region located in the silicon carbide layer; a p-type body region located in the silicon carbide layer and located between the drift region and the first plane; an n-type first source region located in the silicon carbide layer, located between the body region and the first plane, and contacting the source electrode; an n-type second source region located in the silicon carbide layer, located between the body region and the first plane, and contacting the source electrode, the first gate electrode being located between the first source region and the second source region; a p-type first silicon carbide region located in the silicon carbide layer, located between the drift region and the first plane, contacting the source electrode, a distance between the second plane and the first silicon carbide region being smaller than a distance between the second plane and the first gate electrode, the first gate electrode being located between the first source region and the first silicon carbide region, located between the first gate electrode and the body region, and having a p-type impurity concentration higher than a p-type impurity concentration of the body region; a p-type second silicon carbide region located in the silicon carbide layer, located between the drift region and the first plane, contacting the source electrode, a distance between the second plane and the second silicon carbide region being smaller than a distance between the second plane and the second gate electrode, the second gate electrode being located between the second source region and the second silicon carbide region, located between the second gate electrode and the body region, and having a p-type impurity concentration higher than the p-type impurity concentration of the body region; a first gate insulating layer located between the first gate electrode and the drift region, between the first gate electrode and the body region, between the first gate electrode and the first silicon carbide region, and between the first gate electrode and the first source region; a second gate insulating layer located between the second gate electrode and the drift region, between the second gate electrode and the body region, between the second gate electrode and the second silicon carbide region, and between the second gate electrode and the second source region; a p-type third silicon carbide region located in the silicon carbide layer, located between the second plane and the first gate electrode, and contacting the first silicon carbide region, a first n-type portion to be a part of the drift region being located between the first gate insulating layer and the third silicon carbide region; and a p-type fourth silicon carbide region located in the silicon carbide layer, located between the second plane and the second gate electrode, and contacting the second silicon carbide region, a second n-type portion to be a part of the drift region being located between the second gate insulating layer and the fourth silicon carbide region, and separated from the third silicon carbide region.

FIG. 1 is a schematic cross-sectional view of the semiconductor device according to this embodiment. The semiconductor device according to this embodiment is a trench gate type vertical MOSFET 100 using silicon carbide. The vertical MOSFET 100 is an n-channel MOSFET using electrons as carriers.

Figure 2:
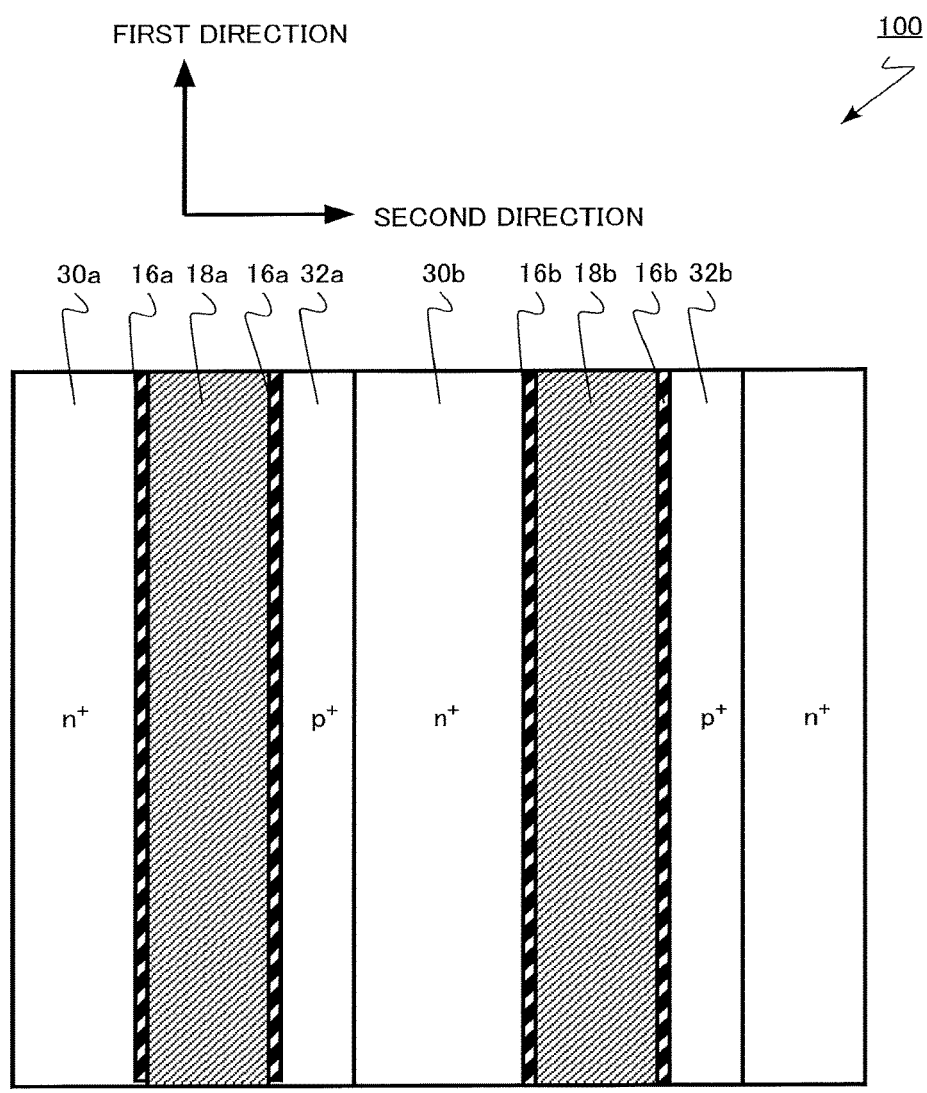
FIG. 2 is a schematic plan view of the semiconductor device according to the first embodiment.

FIG. 2 is a schematic plan view of the semiconductor device according to this embodiment. FIG. 2 is a plan view of a first plane (P1 of FIG. 1) of FIG. 1.

Figure 3:
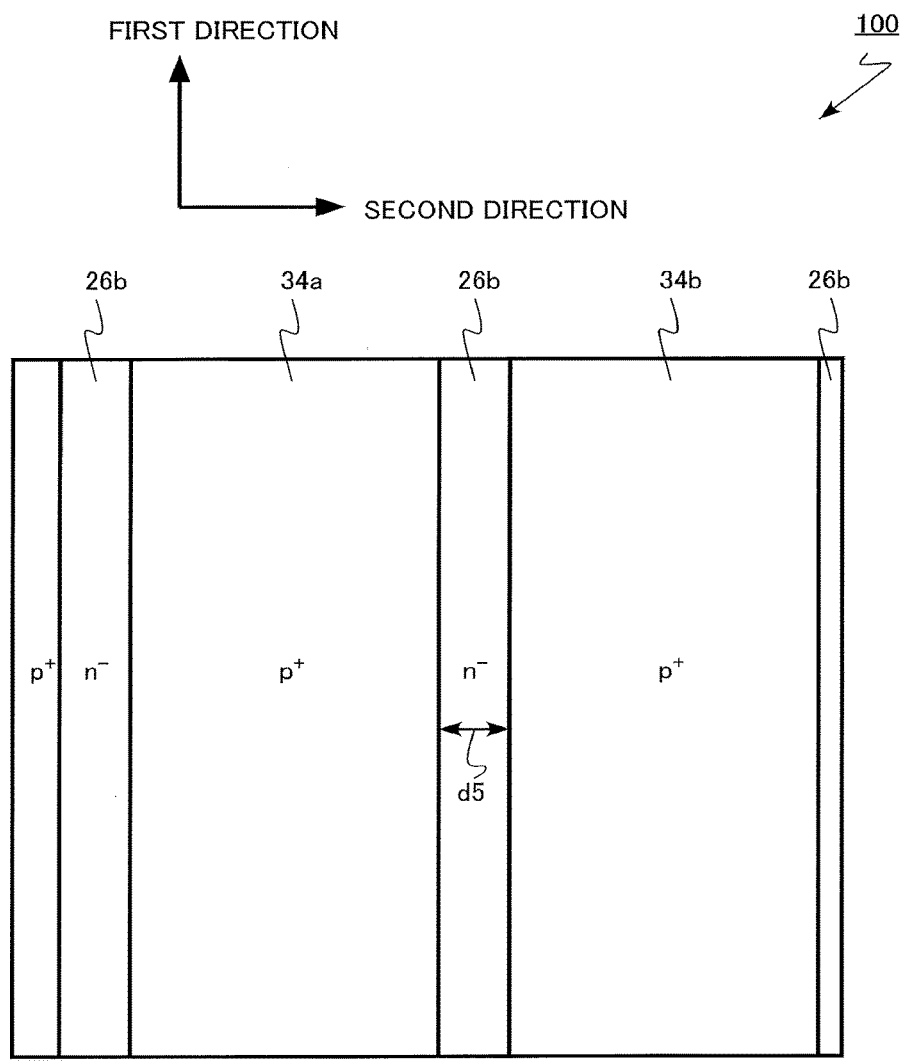
FIG. 3 is a schematic plan view of the semiconductor device according to the first embodiment.

FIG. 3 is a schematic plan view of the semiconductor device according to this embodiment. FIG. 3 is a plan view of a plane Px of FIG. 1.

The MOSFET 100 includes a silicon carbide layer 10, a source electrode 12, a drain electrode 14, a first gate insulating layer 16*a*, a second gate insulating layer 16*b*, a first gate electrode 18*a*, a second gate electrode 18*b*, a first interlayer insulating layer 20*a*, a second interlayer insulating layer 20*b*, a first trench 22*a*, and a second trench 22*b*.

In the silicon carbide layer 10, an n+-type drain region 24, an n−-type or n-type drift region 26, a p-type body region 28, an n+-type first source region 30a, an n+-type second source region 30b, a p+-type first diode region 32a (first silicon carbide region), a p+-type second diode region 32b (second silicon carbide region), a p+-type first current limiting region 34a (third silicon carbide region), and a p+-type second current limiting region 34b (fourth silicon carbide region) are located.

The n−-type or n-type drift region 26 has a first low-concentration region 26a (first n-type region), a high-concentration region 26b (second n-type region), a first field alleviation portion 26w (first n-type portion), and a second field alleviation portion 26x (second n-type portion).

The silicon carbide layer 10 is single crystal SiC. The silicon carbide layer 10 is, for example, 4H—SiC.

The silicon carbide layer 10 includes a first plane ("P1" in FIG. 1) and a second plane ("P2" in FIG. 1). Hereinafter, the first plane is also referred to as a surface and the second plane is also referred to as a back surface. Hereinafter, the "depth" means a depth based on the first plane.

The first plane is, for example, a plane inclined by 0° to 8° (zero degree to eight degree) with respect to a (0001) face. That is, the first plane is a plane in which a normal is inclined by 0° to 8° with respect to a c axis in a [0001] direction. In other words, an off angle with respect to the (0001) face is 0° to 8°. In addition, the second plane is, for example, a plane inclined by 0° to 8° with respect to a (000-1) face.

The (0001) face is referred to as a silicon face. The (000-1) face is referred to as a carbon face. An inclination direction of each of the first plane and the second plane is, for example, a direction of an a axis to be a [11-20] direction. In FIG. 1, a second direction shown in the drawing is the direction of the a axis.

The n+-type drain region 24 is provided at the back surface side of the silicon carbide layer 10. The drain region 24 contains nitrogen (N) as n-type impurities, for example. The n-type impurity concentration of the drain region 24 is, for example, $1 \times 10^{18}$ cm$^{-3}$ to $1 \times 10^{21}$ cm$^{-3}$.

The n−-type or n-type drift region 26 is provided on the drain region 24. The drift region 26 contains nitrogen (N) as n-type impurities, for example. The n-type impurity concentration of the drift region 26 is lower than the n-type impurity concentration of the drain region 24. The n-type impurity concentration of the drift region 26 is, for example, $4 \times 10^{14}$ cm$^{-3}$ to $1 \times 10^{19}$ cm$^{-3}$. Typically, the n-type impurity concentration is, for example, $2 \times 10^{16}$ cm$^{-3}$. A thickness of the drift region 26 is, for example, 5 μm to 150 μm. Typically, the thickness is, for example, 10 μm.

The drift region 26 has an n−-type first low-concentration region 26a and an n-type high-concentration region 26b. The high-concentration region 26b has a function of reducing the on-resistance of the MOSFET 100.

An n-type impurity concentration of the high-concentration region 26b is higher than an n-type impurity concentration of the first low-concentration region 26a. The n-type impurity concentration of the high-concentration region 26b is, for example, $2 \times 10^{17}$ cm$^{-3}$ to $1 \times 10^{19}$ cm$^{-3}$. The n-type impurity concentration is preferably $5 \times 10^{17}$ cm$^{-3}$ to $5 \times 10^{18}$ cm$^{-3}$ and more preferably $8 \times 10^{17}$ cm$^{-3}$ to $3 \times 10^{18}$ cm$^{-3}$. Typically, the n-type impurity concentration is, for example, $1 \times 10^{18}$ cm$^{-3}$. If the n-type impurity concentration of the high-concentration region 26b is lowered, an ability to diffuse a current is lowered and if the n-type impurity concentration is high, a breakdown voltage may not be obtained.

The p-type body region 28 is provided between the drift region 26 and the surface of the silicon carbide layer 10. The body region 28 functions as a channel region of the MOSFET 100. That is, when the MOSFET 100 is turned on, a channel in which electrons flow to a region of the body region 28 contacting the first gate insulating layer 16a and a region of the body region 28 contacting the second gate insulating layer 16b is formed. The region of the body region 28 contacting the first gate insulating layer 16a and the region of the body region 28 contacting the second gate insulating layer 16b become channel formation regions.

In the MOSFET 100, only the body region 28 of one side of the first trench 22a functions as a channel region. In addition, in the MOSFET 100, only the body region 28 of one side of the second trench 22b functions as a channel region.

The body region 28 contains aluminum (Al) as p-type impurities, for example. A p-type impurity concentration of the body region 28 is, for example, $5 \times 10^{16}$ cm$^{-3}$ to $5 \times 10^{17}$ cm$^{-3}$. Typically, the p-type impurity concentration is, for example, $1 \times 10^{17}$ cm$^{-3}$. If the p-type impurity concentration of the body region 28 is low, mobility is improved, but a threshold voltage decreases. If the p-type impurity concentration of the body region 28 is high, the mobility is lowered, but the threshold voltage increases.

For example, the body region 28 is formed with a stacked structure of a low-concentration layer and a high-concentration layer, so that high mobility can be realized by the low-concentration layer and a high threshold voltage can be realized by the high-concentration layer. For example, a p-type impurity concentration of the low-concentration layer is $2 \times 10^{16}$ cm$^{-3}$ and a p-type impurity concentration of the high-concentration layer is $4 \times 10^{17}$ cm$^{-3}$.

A depth of the body region 28 is, for example, 0.2 μm to 1.0 μm. Typically, the depth is, for example, 0.6 μm.

The n+-type first source region 30a is provided between the body region 28 and the surface of the silicon carbide layer 10. The first source region 30a contacts the source electrode 12. The first source region 30a contacts the first gate insulating layer 16a.

The first source region 30a contains phosphorus (P) as n-type impurities, for example. An n-type impurity concentration of the first source region 30a is higher than the n-type impurity concentration of the drift region 26.

The n-type impurity concentration of the first source region 30a is, for example, $1 \times 10^{19}$ cm$^{-3}$ to $1 \times 10^{21}$ cm$^{-3}$. A depth of the first source region 30a is smaller than the depth of the body region 28 and the depth is, for example, 0.1 μm to 0.3 μm. Typically, the depth is, for example, 0.2 μm. A distance between the drift region 26 and the first source region 30a is, for example, 0.1 μm to 0.9 μm. Typically, the distance is, for example, 0.4 μm.

The n+-type second source region 30b is provided between the body region 28 and the surface of the silicon carbide layer 10. The second source region 30b contacts the source electrode 12. The second source region 30b contacts the second gate insulating layer 16b.

The second source region 30b contains phosphorus (P) as n-type impurities, for example. An n-type impurity concentration of the second source region 30b is higher than the n-type impurity concentration of the drift region 26.

The n-type impurity concentration of the second source region 30b is, for example, $1 \times 10^{19}$ cm$^{-3}$ to $1 \times 10^{21}$ cm$^{-3}$. A depth of the second source region 30b is smaller than the depth of the body region 28 and the depth is, for example, 0.1 μm to 0.3 μm. Typically, the depth is, for example, 0.2 μm. A distance between the drift region 26 and the second source region 30b is, for example, 0.1 µm to 0.9 µm. Typically, the distance is, for example, 0.4 µm.

The first source region 30a and the second source region 30b have the same shape and impurity concentration in a range of a manufacturing variation.

The p+-type first diode region 32a is provided between the drift region 26 and the surface of the silicon carbide layer 10. The first diode region 32a contacts the source electrode 12.

A distance (d1 of FIG. 1) between a back surface of the silicon carbide layer 10 and the first diode region 32a is smaller than a distance (d2 of FIG. 1) between the back surface of the silicon carbide layer 10 and the first gate electrode 18a.

The first gate electrode 18a is located between the first diode region 32a and the first source region 30a. The first diode region 32a is located between the first gate electrode 18a and the body region 28.

A depth of the first diode region 32a is larger than a depth of an end portion of the first gate insulating layer 16a at the back surface side of the silicon carbide layer 10.

In the first diode region 32a, a pn junction between the first diode region 32a and the drift region 26 functions as a body diode of the MOSFET 100. In addition, the first diode region 32a has a function of reducing contact resistance between the source electrode 12 and the silicon carbide layer 10. A potential of the body region 28 is fixed to a source potential by the first diode region 32a.

In addition, a field applied to the first gate insulating layer 16a contacting the first diode region 32a is alleviated by the first diode region 32a. Therefore, a breakdown voltage of the first gate insulating layer 16a is improved.

A p-type impurity concentration of the first diode region 32a is higher than the p-type impurity concentration of the body region 28, for example. The p-type impurity concentration is, for example, $1 \times 10^{18}$ cm$^{-3}$ to $1 \times 10^{21}$ cm$^{-3}$. Typically, the p-type impurity concentration is, for example, $1 \times 10^{19}$ cm$^{-3}$. In addition, a contact portion with a metal preferably has a high concentration, for example, $1 \times 10^{19}$ cm$^{-3}$ to $1 \times 10^{21}$ cm$^{-3}$.

The p+-type second diode region 32b is provided between the drift region 26 and the surface of the silicon carbide layer 10. The second diode region 32b contacts the source electrode 12.

A distance between the back surface of the silicon carbide layer 10 and the second diode region 32b is smaller than a distance between the back surface of the silicon carbide layer 10 and the second gate electrode 18b.

The second gate electrode 18b is located between the second diode region 32b and the second source region 30b. The second diode region 32b is located between the second gate electrode 18b and the body region 28.

A depth of the second diode region 32b is larger than a depth of an end portion of the second gate insulating layer 16b at the back surface side of the silicon carbide layer 10.

In the second diode region 32b, a pn junction between the second diode region 32b and the drift region 26 functions as the body diode of the MOSFET 100. In addition, the second diode region 32b has a function of reducing contact resistance between the source electrode 12 and the silicon carbide layer 10. The potential of the body region 28 is fixed to the source potential by the second diode region 32b.

In addition, a field applied to the second gate insulating layer 16b contacting the second diode region 32b is alleviated by the second diode region 32b. Therefore, a breakdown voltage of the second gate insulating layer 16b is improved.

A p-type impurity concentration of the second diode region 32b is higher than the p-type impurity concentration of the body region 28. The p-type impurity concentration is, for example, $1 \times 10^{18}$ cm$^{-3}$ to $1 \times 10^{21}$ cm$^{-3}$. Typically, the p-type impurity concentration is, for example, $1 \times 10^{19}$ cm$^{-3}$. In addition, a contact portion with a metal preferably has a high concentration, for example, $1 \times 10^{19}$ cm$^{-3}$ to $1 \times 10^{21}$ cm$^{-3}$.

The first diode region 32a and the second diode region 32b have the same shape and impurity concentration in a range of a manufacturing variation.

The first gate electrode 18a is provided between the source electrode 12 and the drain electrode 14. The first gate electrode 18a is provided in the first trench 22a formed in the silicon carbide layer 10. The first gate electrode 18a is provided on the first gate insulating layer 16a. The first gate electrode 18a extends in a first direction parallel to the surface of the silicon carbide layer 10.

The first gate electrode 18a is a conductive layer. The first gate electrode 18a is, for example, polycrystalline silicon containing p-type impurities or n-type impurities.

The second gate electrode 18b is provided between the source electrode 12 and the drain electrode 14. The second gate electrode 18b is provided in the second trench 22b formed in the silicon carbide layer 10. The second gate electrode 18b is provided on the second gate insulating layer 16b. The second gate electrode 18b extends in the first direction parallel to the surface of the silicon carbide layer 10.

The second gate electrode 18b is a conductive layer. The second gate electrode 18b is, for example, polycrystalline silicon containing p-type impurities or n-type impurities.

The first gate insulating layer 16a is provided between the drift region 26, the body region 28, the first diode region 32a, and the first source region 30a and the first gate electrode 18a. The first gate insulating layer 16a is provided in the first trench 22a.

The first gate insulating layer 16a provided on one side surface of the first trench 22a contacts the first diode region 32a and is covered with the first diode region 32a.

The depth of the end portion of the first gate insulating layer 16a at the back surface side of the silicon carbide layer 10 is larger than the depth of the body region 28. In other words, a distance between the first gate insulating layer 16a and the drain electrode 14 is smaller than a distance between the body region 28 and the drain electrode 14.

The first gate insulating layer 16a is, for example, a silicon oxide film. For example, a high-k insulating film (high-permittivity insulating film such as HfSiON, ZrSiON, and AlON) can be applied to the first gate insulating layer 16a. In addition, a stacked film of the silicon oxide film (SiO$_2$) and the high-K insulating film is also effective for improving drive performance or improving breakdown voltage characteristics. By increasing the thickness of the gate insulating film at the bottom of the trench, the breakdown voltage can be improved. By increasing the thickness of the gate insulating film at the side contacting the first diode region 32a, the width of the first diode region 32a can be reduced and the device can be miniaturized.

The second gate insulating layer 16b is provided between the drift region 26, the body region 28, the second diode region 32b, and the second source region 30b and the second gate electrode 18b. The second gate insulating layer 16b is provided in the second trench 22b.

The second gate insulating layer 16b provided on one side surface of the second trench 22b contacts the second diode region 32b and is covered with the second diode region 32b.

The depth of the end portion of the second gate insulating layer 16b at the back surface side of the silicon carbide layer 10 is larger than the depth of the body region 28. In other words, a distance between the second gate insulating layer 16b and the drain electrode 14 is smaller than a distance between the body region 28 and the drain electrode 14.

The second gate insulating layer 16b is, for example, a silicon oxide film. For example, a high-k insulating film (high-permittivity insulating film such as HfSiON, ZrSiON, and AlON) can be applied to the second gate insulating layer 16b. In addition, a stacked film of the silicon oxide film ($SiO_2$) and the high-K insulating film is also effective for improving drive performance or improving breakdown voltage characteristics. By increasing the thickness of the gate insulating film at the bottom of the trench, the breakdown voltage can be improved. By increasing the thickness of the gate insulating film at the side contacting the second diode region 32b, the width of the second diode region 32b can be reduced and the device can be miniaturized.

The $p^+$-type first current limiting region 34a is located between the back surface of the silicon carbide layer 10 and the first gate electrode 18a. The first current limiting region 34a contacts the first diode region 32a. The $p^+$-type first current limiting region 34a extends in the first direction.

In particular, the first current limiting region 34a has a function of limiting an amount of on-current or a path of the on-current at the time of load short circuiting of the MOSFET 100.

The first field alleviation portion 26w is located between the first current limiting region 34a and the first gate electrode 18a. The first field alleviation portion 26w is located between the first current limiting region 34a and the first gate insulating layer 16a. The first field alleviation portion 26w is a part of the drift region 26. The first field alleviation portion 26w is located in the n-type high-concentration region 26b.

For example, a distance (d3 of FIG. 1) between the first current limiting region 34a and the first gate insulating layer 16a is 0.05 µm to 0.2 µm.

For example, a distance (d1 of FIG. 1) between the back surface of the silicon carbide layer 10 and the first diode region 32a is smaller than a distance (d4 of FIG. 1) between the back surface of the silicon carbide layer 10 and the first current limiting region 34a. In other words, the depth of the first diode region 32a is larger than the depth of the first current limiting region 34a.

For example, a width of the first current limiting region 34a in the second direction is larger than a width of the first diode region 32a in the second direction.

For example, an end portion of the first current limiting region 34a exists at the side of the first diode region 32a from an extension line of the side surface of the first trench 22a at the side where the channel formation region exists.

A p-type impurity concentration of the first current limiting region 34a is higher than the p-type impurity concentration of the body region 28. The p-type impurity concentration is, for example, $6 \times 10^{18}$ $cm^{-3}$ to $1 \times 10^{20}$ $cm^{-3}$. Typically, the p-type impurity concentration is, for example, $2 \times 10^{19}$ $cm^{-3}$.

For example, the p-type impurity concentration of the first current limiting region 34a is higher than the p-type impurity concentration of the first diode region 32a coming close to the first current limiting region 34a. For example, the p-type impurity concentration of the first current limiting region 34a is higher than the p-type impurity concentration near the bottom of the first diode region 32a.

In particular, the second current limiting region 34b has a function of limiting an amount of on-current or a path of the on-current at the time of load short circuiting of the MOSFET 100.

The second field alleviation portion 26x is located between the second current limiting region 34b and the second gate electrode 18b. The second field alleviation portion 26x is located between the second current limiting region 34b and the second gate insulating layer 16b. The second field alleviation portion 26x is a part of the drift region 26. The second field alleviation portion 26x is located in the n-type high-concentration region 26b.

For example, a distance between the second current limiting region 34b and the second gate insulating layer 16b is 0.05 µm to 0.2 µm.

For example, a distance between the back surface of the silicon carbide layer 10 and the second diode region 32b is smaller than a distance between the back surface of the silicon carbide layer 10 and the second current limiting region 34b. In other words, the depth of the second diode region 32b is larger than the depth of the second current limiting region 34b.

For example, a width of the second current limiting region 34b in the second direction is larger than a width of the second diode region 32b in the second direction.

For example, an end portion of the second current limiting region 34b exists at the side of the second diode region 32b from an extension line of the side surface of the second trench 22b at the side where the channel formation region exists.

A p-type impurity concentration of the second current limiting region 34b is higher than the p-type impurity concentration of the body region 28. The p-type impurity concentration is, for example, $6 \times 10^{18}$ $cm^{-3}$ to $1 \times 10^{20}$ $cm^{-3}$. Typically, the p-type impurity concentration is, for example, $2 \times 10^{19}$ $cm^{-3}$.

For example, the p-type impurity concentration of the second current limiting region 34b is higher than the p-type impurity concentration of the second diode region 32b coming close to the second current limiting region 34b. For example, the p-type impurity concentration of the second current limiting region 34b is higher than the p-type impurity concentration near the bottom of the second diode region 32b.

The first current limiting region 34a and the second current limiting region 34b have the same shape and impurity concentration in a range of a manufacturing variation.

For example, a distance (d5 of FIG. 1) between the first current limiting region 34a and the second current limiting region 34b is smaller than a distance (d6 of FIG. 1) between the first diode region 32a and the second gate insulating layer 16b.

In addition, a boundary (position shown by a dotted line in FIG. 1) between the first low-concentration region 26a and the high-concentration region 26b is preferably located closer to the back surface of the silicon carbide layer 10 than the first current limiting region 34a and the second current limiting region 34b. As a result, a current easily flows around the back side of the first current limiting region 34a or the second current limiting region 34b and low resistance is realized.

The first interlayer insulating layer 20a is provided on the first gate electrode 18a. The first interlayer insulating layer 20a is, for example, a silicon oxide film.

The second interlayer insulating layer 20b is provided on the second gate electrode 18b. The second interlayer insulating layer 20b is, for example, a silicon oxide film.

The source electrode 12 is provided on the surface of the silicon carbide layer 10. The source electrode 12 contacts the first source region 30a, the second source region 30b, the first diode region 32a, and the second diode region 32b.

The source electrode 12 contains a metal. The metal forming the source electrode 12 has a stacked structure of titanium (Ti) and aluminum (Al), for example. The source electrode 12 may contain metal silicide or metal carbide that contacts the silicon carbide layer 10.

The drain electrode 14 is provided on the back surface of the silicon carbide layer 10. The drain electrode 14 contacts the drain region 24.

The drain electrode 14 is, for example, a metal or a metal semiconductor compound. The drain electrode 14 contains a material selected from the group consisting of nickel silicide (NiSi), titanium (Ti), nickel (Ni), silver (Ag), and gold (Au), for example.

Hereinafter, a function and an effect of the semiconductor device according to the embodiment will be described.

In the MOSFET 100 according to this embodiment, the amount of on-current or the path of the on-current at the time of load short circuiting of the MOSFET 100 can be limited by the first current limiting region 34a and the second current limiting region 34b. Therefore, a short circuit tolerance of the MOSFET 100 can be improved. Details will be described below.

In a trench gate type MOSFET in which a gate electrode is provided in a trench, on-resistance per unit area can be reduced and an on-current can be increased. However, in the case where load short circuiting occurs at the output side of the MOSFET, because the on-resistance is low, time until an excessive current flows and breakdown occurs may be shortened. That is, a short circuit tolerance may decrease. In the MOSFET, it is required to guarantee the short circuit tolerance of 10 microseconds or more.

Figure 4:
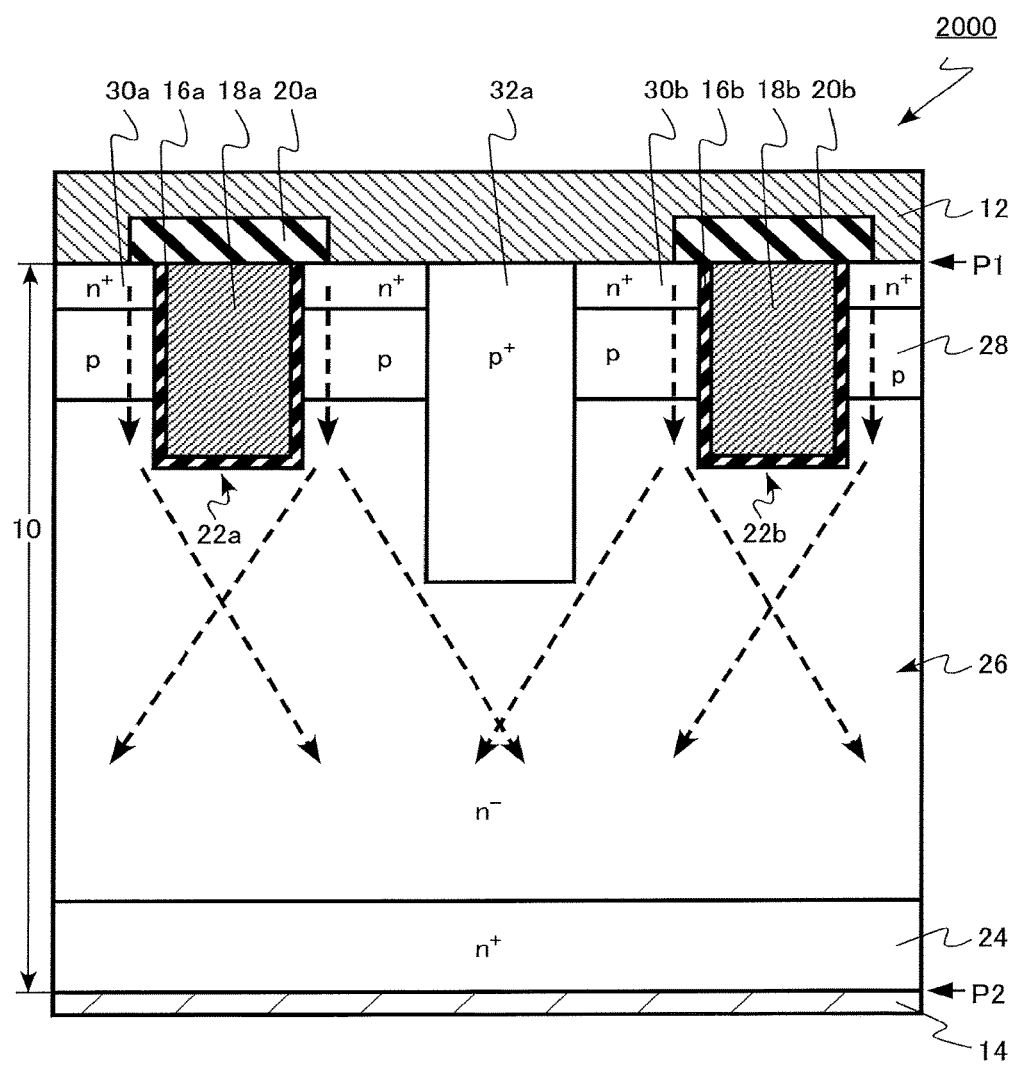
FIG. 4 is a schematic cross-sectional view of a semiconductor device according to a first comparative example.

FIG. 4 is a schematic cross-sectional view of a semiconductor device according to a first comparative example. A MOSFET 2000 is different from the MOSFET 100 according to this embodiment in that the body region 28 at both sides of the first trench 22a and the body region 28 at both sides of the second trench 22b function as channel regions. In addition, the MOSFET 2000 is different from the MOSFET 100 in that the first current limiting region 34a and the second current limiting region 34b are not included.

In FIG. 4, a path of an on-current is shown by a dotted arrow. As apparent from FIG. 4, because the channel regions are formed at both sides of the first trench 22a during an on-operation, currents flowing from both the channel regions to the drift region 26 cross immediately below the first trench 22a and an on-current density increases. Therefore, when load short circuiting occurs, an amount of heat generated immediately below the first trench 22a increases and time until breakdown occurs may be shortened. Accordingly, a short circuit tolerance decreases.

Figure 5:
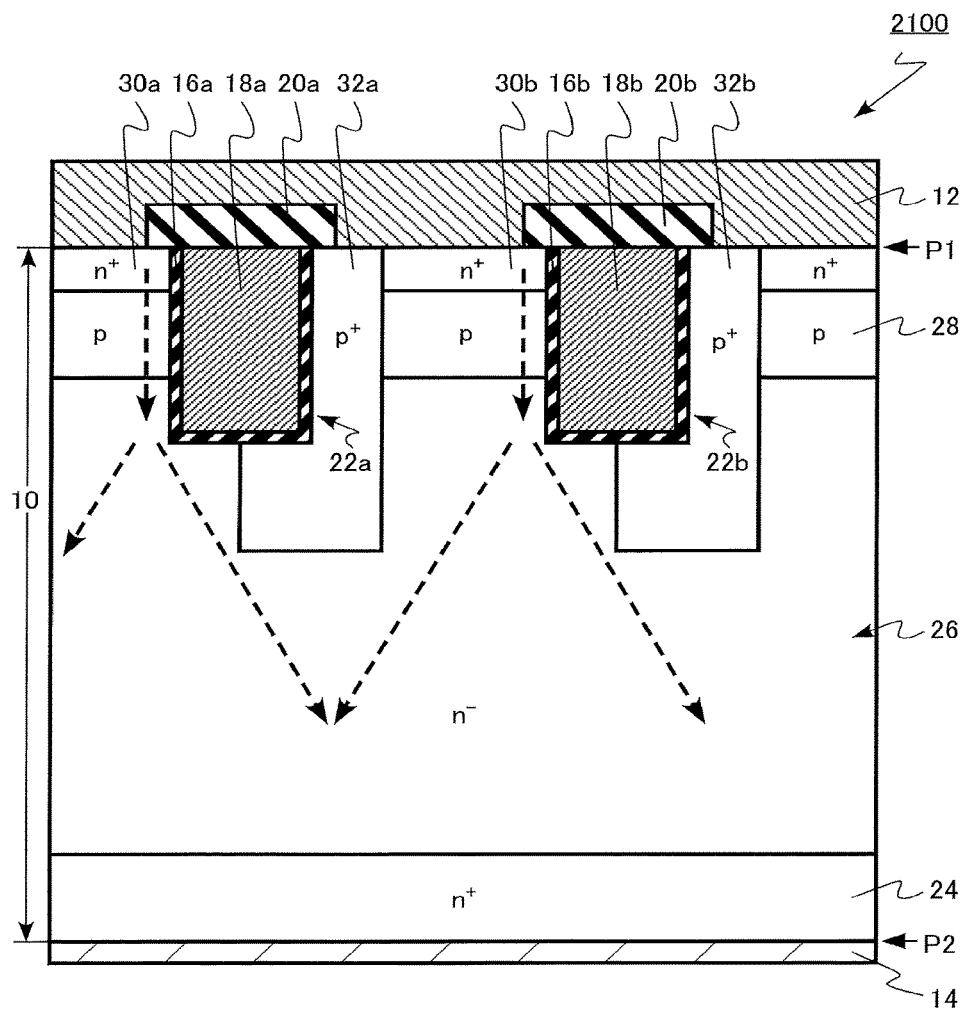
FIG. 5 is a schematic cross-sectional view of a semiconductor device according to a second comparative example.

FIG. 5 is a schematic cross-sectional view of a semiconductor device according to a second comparative example. A MOSFET 2100 is different from the MOSFET 100 according to this embodiment in that the first current limiting region 34a and the second current limiting region 34b are not included.

In FIG. 5, a path of an on-current is shown by a dotted arrow. As apparent from FIG. 5, channel regions are formed in only the body region 28 of one side of the first trench 22a and the body region 28 of one side of the second trench 22b, during an on-operation. Since a distance between the two channel regions adjacent to each other is long, crossing of currents flowing from the two channel regions to the drift region 26 is suppressed. Therefore, an amount of heat generated when load short circuiting occurs is suppressed and time until breakdown occurs may be lengthened. Accordingly, the short circuit tolerance is improved.

Figure 6:
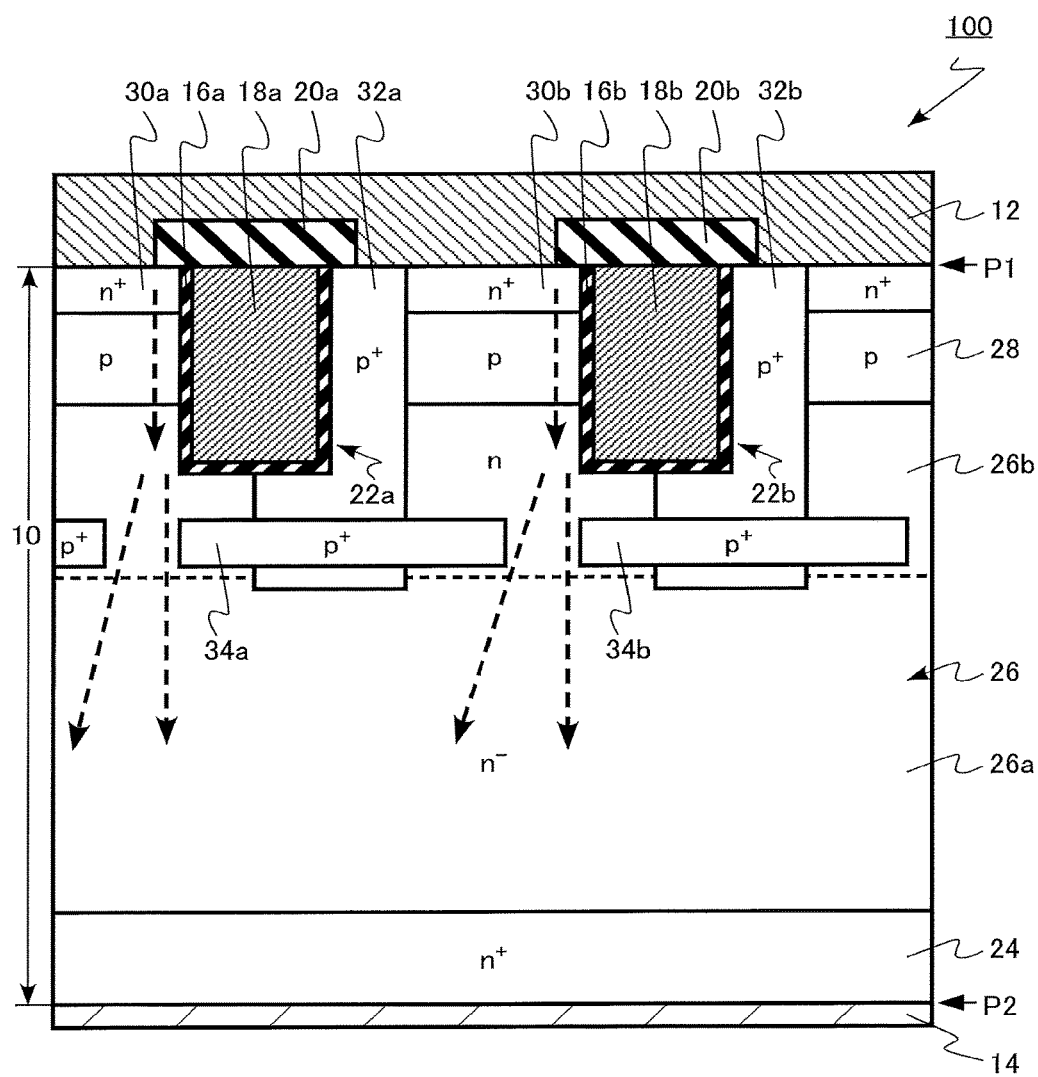
FIG. 6 is an explanatory view of a function and an effect of the semiconductor device according to the first embodiment.

FIG. 6 is an explanatory view of a function and an effect of the semiconductor device according to this embodiment. In the MOSFET 100 according to this embodiment, the first current limiting region 34a and the second current limiting region 34b are added to the configuration of the MOSFET 2100. By including the first current limiting region 34a and the second current limiting region 34b, an amount of current flowing from the channel region to the drift region 26 and an extension of a path of the current are suppressed. The path of the current flowing from the channel region to the drift region 26 is limited to a narrow region. Therefore, the amount of currents flowing from the two adjacent channel regions to the drift region 26 and crossing of the currents are suppressed. Therefore, the amount of heat generated when load short circuiting occurs is further suppressed and the time until the breakdown occurs is further lengthened. Therefore, the short circuit tolerance is further improved.

From the viewpoint of limiting the path of the current flowing from the channel region to the drift region 26, the distance (d5 of FIG. 1) between the first current limiting region 34a and the second current limiting region 34b is preferably smaller than the distance (d6 of FIG. 1) between the first diode region 32a and the second gate insulating layer 16b.

From the viewpoint of limiting the path of the current flowing from the channel region to the drift region 26, the width of the first current limiting region 34a in the second direction is preferably larger than the width of the first diode region 32a in the second direction. Due to the same reason, the width of the second current limiting region 34b in the second direction is preferably larger than the width of the second diode region 32b in the second direction.

From the viewpoint of appropriately limiting the path of the current flowing from the channel region to the drift region 26, the p-type impurity concentration of each of the first current limiting region 34a and the second current limiting region 34b is preferably $6 \times 10^{18}$ cm$^{-3}$ to $1 \times 10^{20}$ cm$^{-3}$ and more preferably $8 \times 10^{18}$ cm$^{-3}$ to $4 \times 10^{19}$ cm$^{-3}$. Typically, the p-type impurity concentration is, for example, $2 \times 10^{19}$ cm$^{-3}$.

From the viewpoint of not excessively limiting the path of the current flowing from the channel region to the drift region 26, the end portion of the first current limiting region 34a preferably exists at the side of the first diode region 32a from the extension line of the side surface of the first trench 22a at the side where the channel formation region exists, and the end portion of the second current limiting region 34b preferably exists at the side of the second diode region 32b from the extension line of the side surface of the second trench 22b at the side where the channel formation region exists.

The ends, which are opposite to the channel formation regions, of the first current limiting region 34a and the second current limiting region 34b can adjust the positions so that crossing of the current paths in the drift region 26 is minimized.

In the MOSFET 100, the n-type first field alleviation portion 26w exists between the p$^+$-type first current limiting region 34a and the first gate insulating layer 16a. By providing the first field alleviation portion 26w, it is possible to alleviate the field applied to the first gate insulating layer 16a when the MOSFET 100 is turned off. In other words, as compared with the case when the first field alleviation portion 26w does not exist, that is, when the first current limiting region 34a contacts the first gate insulating layer 16, the field applied to the first gate insulating layer 16a is alleviated. Therefore, the breakdown voltage of the first gate insulating layer 16a is improved and reliability of the MOSFET 100 is improved. The n-type first field alleviation portion 26w becomes a barrier layer of hot holes. The n-type first field alleviation portion 26w is also effective for preventing breakdown of the first gate insulating layer 16a due to avalanche.

Likewise, the n-type second field alleviation portion 26x exists between the second current limiting region 34b and the second gate insulating layer 16b, so that the breakdown voltage of the second gate insulating layer 16b is also improved.

From the viewpoint of improving the breakdown voltage of the first gate insulating layer 16a, the distance (d3 of FIG. 1) between the first current limiting region 34a and the first gate insulating layer 16a is preferably 0.05 µm to 0.2 µm. Due to the same reason, the distance between the second current limiting region 34b and the second gate insulating layer 16b is preferably 0.05 µm to 0.2 µm.

When the p-type impurity concentrations of the first current limiting region 34a and the second current limiting region 34b are higher than the p-type impurity concentrations of the first diode region 32a and the second diode region 32b, crystal defects induced at the time of forming the first current limiting region 34a and the second current limiting region 34b may degrade the diode characteristics. Therefore, the depths of the first diode region 32a and the second diode region 32b are preferably caused to be larger than the depths of the first current limiting region 34a and the second current limiting region 34b so that the diode characteristics depend on the attributes of the first diode region 32a and the second diode region 32b mainly.

In particular, from the viewpoint of increasing the on-current in the normal on-state of the MOSFET 100, the drift region 26 preferably has the n⁻-type first low-concentration region 26a and the n-type high-concentration region 26b. The resistance of the region to be the path of the on-current is reduced and the current efficiently diffuses in the drift region 26. Therefore, the on-current increases.

The n-type impurity concentration of the first low-concentration region 26a is, for example, $4 \times 10^{14}$ cm$^{-3}$ to $1 \times 10^{19}$ cm$^{-3}$. Typically, the n-type impurity concentration is, for example, $2 \times 10^{16}$ cm$^{-3}$. An n-type impurity concentration of the high-concentration region 26b is higher than an n-type impurity concentration of the first low-concentration region 26a. The n-type impurity concentration of the high-concentration region 26b is, for example, $2 \times 10^{17}$ cm$^{-3}$ to $1 \times 10^{19}$ cm$^{-3}$. The n-type impurity concentration is preferably $5 \times 10^{17}$ cm$^{-3}$ to $5 \times 10^{18}$ cm$^{-3}$ and more preferably $8 \times 10^{17}$ cm$^{-3}$ to $3 \times 10^{18}$ cm$^{-3}$. Typically, the n-type impurity concentration is, for example, $1 \times 10^{18}$ cm$^{-3}$. If the concentration is low, the ability to diffuse the current is lowered and if the concentration is high, the breakdown voltage is not obtained. If the concentration falls below the above range, the on-resistance may excessively increase. In addition, if the concentration exceeds the above range, sufficient current suppression may not be performed at the time of load short circuiting.

In this embodiment, the case where inclination angles between the side surfaces of the first trench 22a and the second trench 22b and the surface of the silicon carbide layer 10 are 90° has been described as an example. However, the inclination angles are not necessarily limited to 90°.

For example, in the case where the second direction is the direction of the a axis, from the viewpoint of maximizing the mobility of the electrons, the side surfaces of the first trench 22a and the second trench 22b, where the channel regions are formed are preferably matched with the a face, that is, the (11-20) face. Therefore, for example, if an off-angle of the first plane with respect to the (0001) face is set to α, the inclination angle of the side surface of the trench is preferably set to 90°-α. At this time, because the other side surface forming a pair is not matched with the (11-20) face, the non-matched side surface is not used as the channel region.

Preferably, the first trench 22a and the second trench 22b are formed so that the first direction in which the first trench 22a and the second trench 22b extend is the a axis and the inclination angle of the side surface of the trench is 90°. The side surface of the trench is matched with the m face, that is, the (1-100) face and the mobility of the electrons is improved. At this time, both the two side faces forming a pair are matched with the (1-100) face.

From the viewpoint of maximizing the density of the trenches and reducing the on-resistance per unit area, the inclination angles between the side surfaces of the first trench 22a and the second trench 22b and the surface of the silicon carbide layer 10 are preferably 90°. In the case of considering a structure of a MOSFET with a channel region on one side of a trench structure and a breakdown voltage structure and a diode on the opposite side as a unit, a structure formed at an angle of 90° becomes the smallest unit. Therefore, the density of the trenches can be maximized.

Generally speaking, the off-angle is provided in a substrate to realize epitaxial growth. However, by forming a plane having a side surface of 90° in a direction vertical to the off-angle, forming one side surface as a channel region, and causing a side surface forming a pair to have a breakdown voltage structure, a PiN built-in MOSFET with a high trench density can be formed.

In this embodiment, the case where the film thickness of the first gate insulating layer 16a at both side surfaces of the first trench 22a is the same has been described as an example. However, for example, the film thickness of the first gate insulating layer 16a at the side surface contacting the first diode region 32a can be larger than the film thickness of the first gate insulating layer 16a at the side surface contacting the body region 28. At this time, the width of the first diode region 32a can be decreased, thereby decreasing the width of the unit. Finally, the trench density is improved. Likewise, for example, the film thickness of the second gate insulating layer 16b at side surface contacting the second diode region 32b can be larger than the film thickness of the second gate insulating layer 16b at the side surface contacting the body region 28. At this time, the width of the second diode region 32b can be decreased, thereby decreasing the width of the unit. Finally, the trench density is improved.

According to the MOSFET 100 according to this embodiment, the heat generated at the time of the load short circuiting is suppressed and the short circuit tolerance is improved. In addition, a breakdown voltage of the gate insulating layer is improved and reliability is improved.

Second Embodiment

A semiconductor device according to this embodiment is the same as the semiconductor device according to the first embodiment, except that a drift region has, between the second n-type region and a body region, a third n-type region with an n-type impurity concentration lower than that of a second n-type region. Hereinafter, description of contents overlapping with those of the first embodiment will be omitted.

Figure 7:
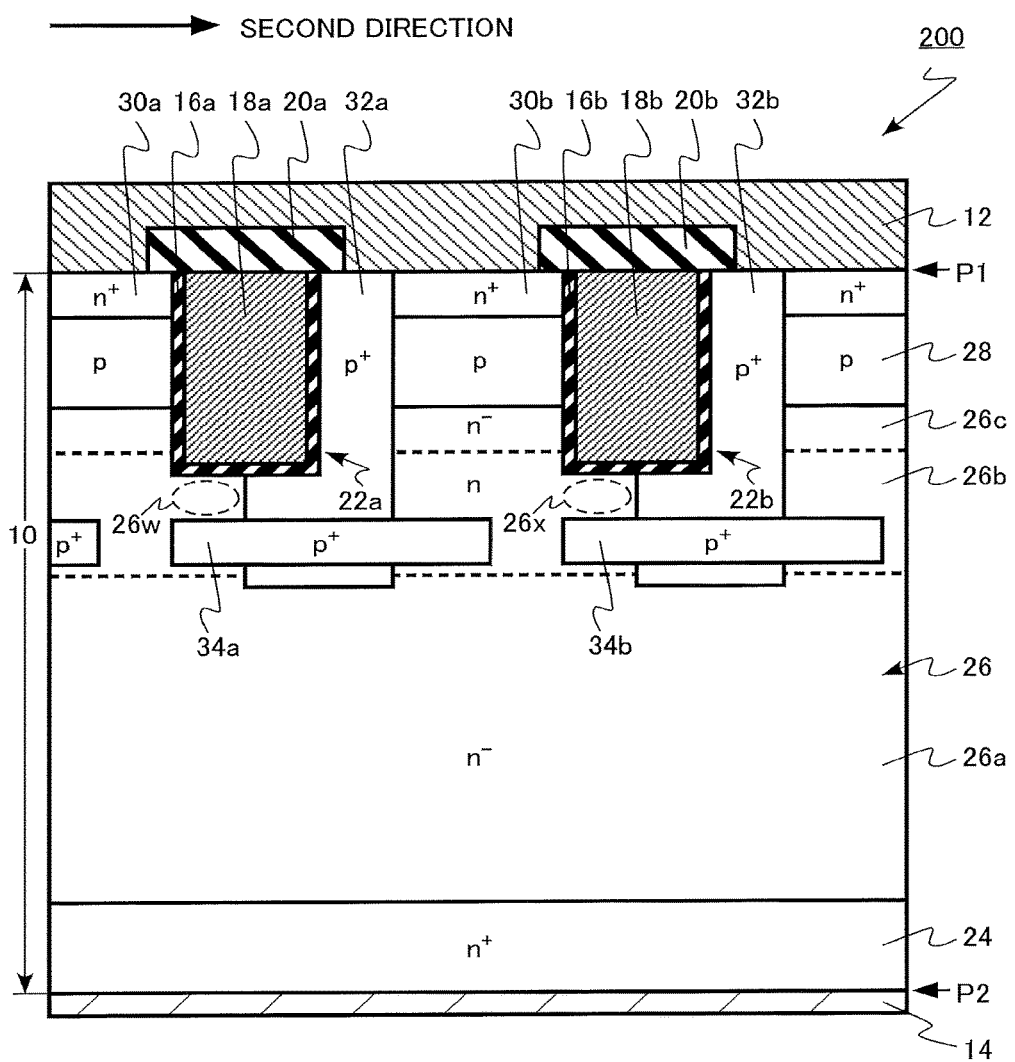
FIG. 7 is a schematic cross-sectional view of a semiconductor device according to a second embodiment.

FIG. 7 is a schematic cross-sectional view of the semiconductor device according to this embodiment. The semiconductor device according to this embodiment is a trench gate type vertical MOSFET 200 using silicon carbide.

An n⁻-type or n-type drift region 26 has a first low-concentration region 26a (first n-type region), a high-concentration region 26b (second n-type region), and a second low-concentration region 26c (third n-type region).

The second low-concentration region 26c is provided between the high-concentration region 26b and a body region 28. An n-type impurity concentration of the second low-concentration region 26c is lower than an n-type impurity concentration of the high-concentration region 26b. The n-type impurity concentration of the second low-concentration region 26c is, for example, $4 \times 10^{14}$ cm$^{-3}$ to $1 \times 10^{19}$ cm$^{-3}$. Typically, the n-type impurity concentration is, for example, $2 \times 10^{16}$ cm$^{-3}$.

Since the MOSFET 200 includes the second low-concentration region 26c, a threshold voltage can be increased.

According to the MOSFET 200 according to this embodiment, a short circuit tolerance and reliability are improved, similar to the first embodiment. In addition, the threshold voltage can be increased.

Third Embodiment

A semiconductor device according to this embodiment is the same as the semiconductor device according to the first embodiment, except that a body region has a first p-type region and a second p-type region located between the first p-type region and a drift region and having a p-type impurity concentration higher than that of the first p-type region. Hereinafter, description of contents overlapping with those of the first embodiment will be omitted.

Figure 8:
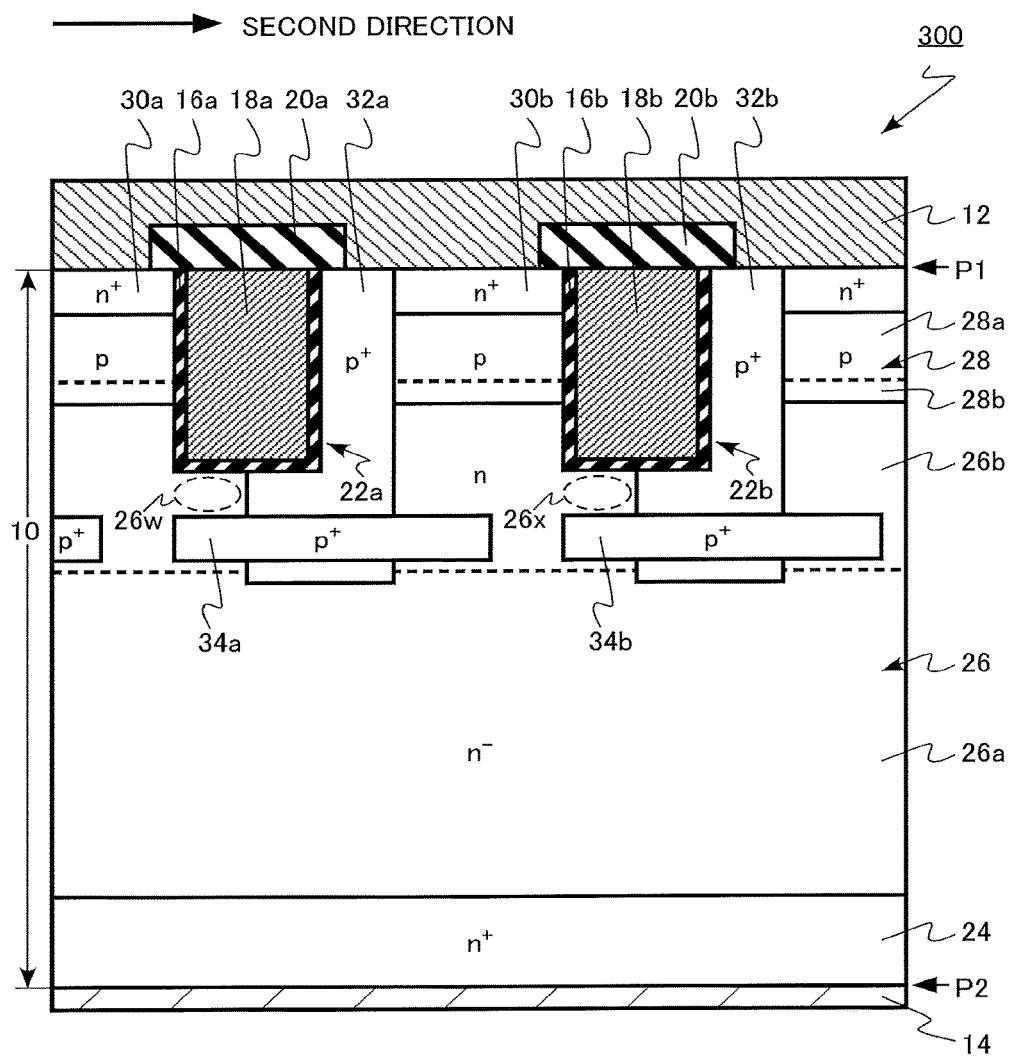
FIG. 8 is a schematic cross-sectional view of a semiconductor device according to a third embodiment.

FIG. 8 is a schematic cross-sectional view of the semiconductor device according to this embodiment. The semiconductor device according to this embodiment is a trench gate type vertical MOSFET 300 using silicon carbide.

A p-type body region 28 has a low-concentration region 28a (first p-type region) and a high-concentration region 28b (second p-type region).

The high-concentration region 28b is located between the low-concentration region 28a and a drift region 26. A p-type impurity concentration of the high-concentration region 28b is higher than a p-type impurity concentration of the low-concentration region 28a.

Since the MOSFET 300 includes the high-concentration region 28b, a threshold voltage can be increased.

According to the MOSFET 300 according to this embodiment, a short circuit tolerance and reliability are improved, similar to the first embodiment. In addition, the threshold voltage can be increased.

Fourth Embodiment

A semiconductor device according to this embodiment is the same as the semiconductor device according to the first embodiment, except that the semiconductor device further includes a p-type fifth silicon carbide region located in a drift region, located between a first gate electrode and a second plane, and extending in a first direction, a p-type sixth silicon carbide region located in the drift region, located between a second source region and the second plane, located between a third silicon carbide region and the second plane, and extending in the first direction, and a p-type seventh silicon carbide region located in the drift region, located between a second gate electrode and the second plane, and extending in the first direction. Hereinafter, description of contents overlapping with those of the first embodiment will be omitted.

Figure 9:
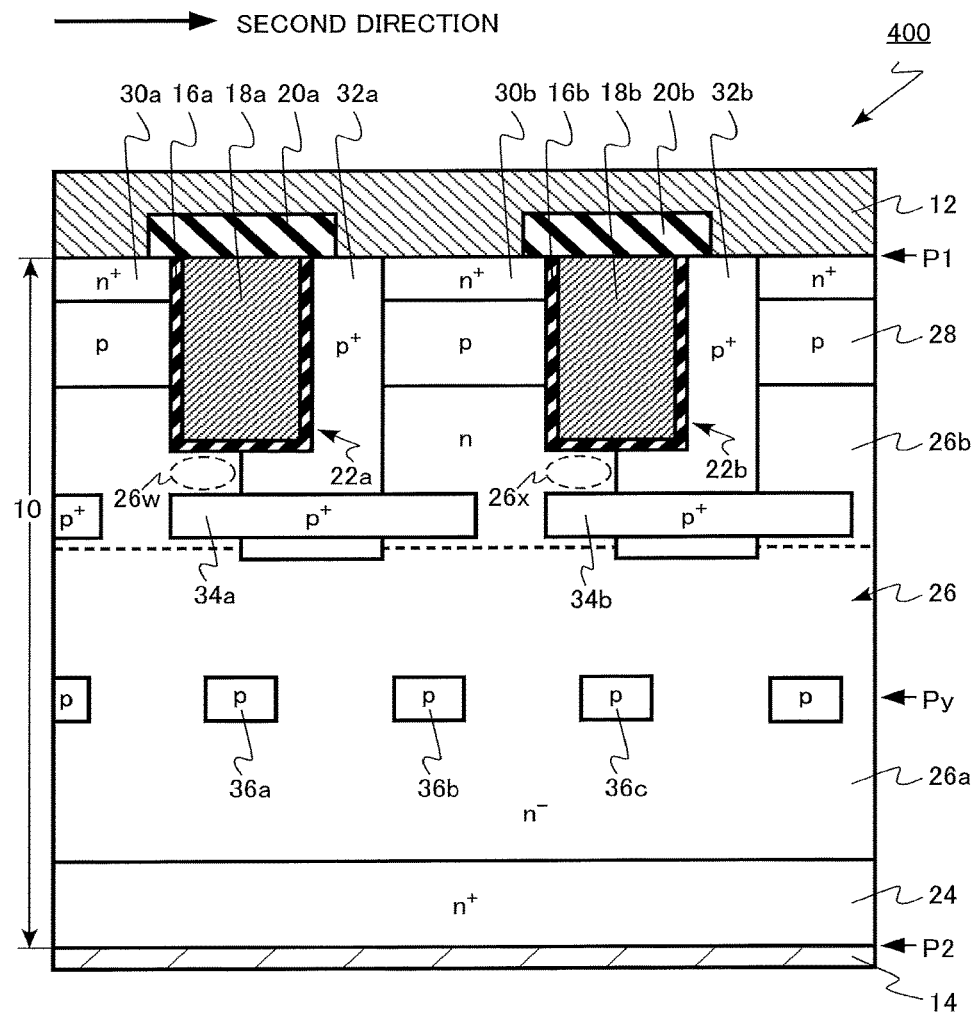
FIG. 9 is a schematic cross-sectional view of a semiconductor device according to a fourth embodiment.

FIG. 9 is a schematic cross-sectional view of the semiconductor device according to this embodiment. The semiconductor device according to this embodiment is a trench gate type vertical MOSFET 400 using silicon carbide.

Figure 10:
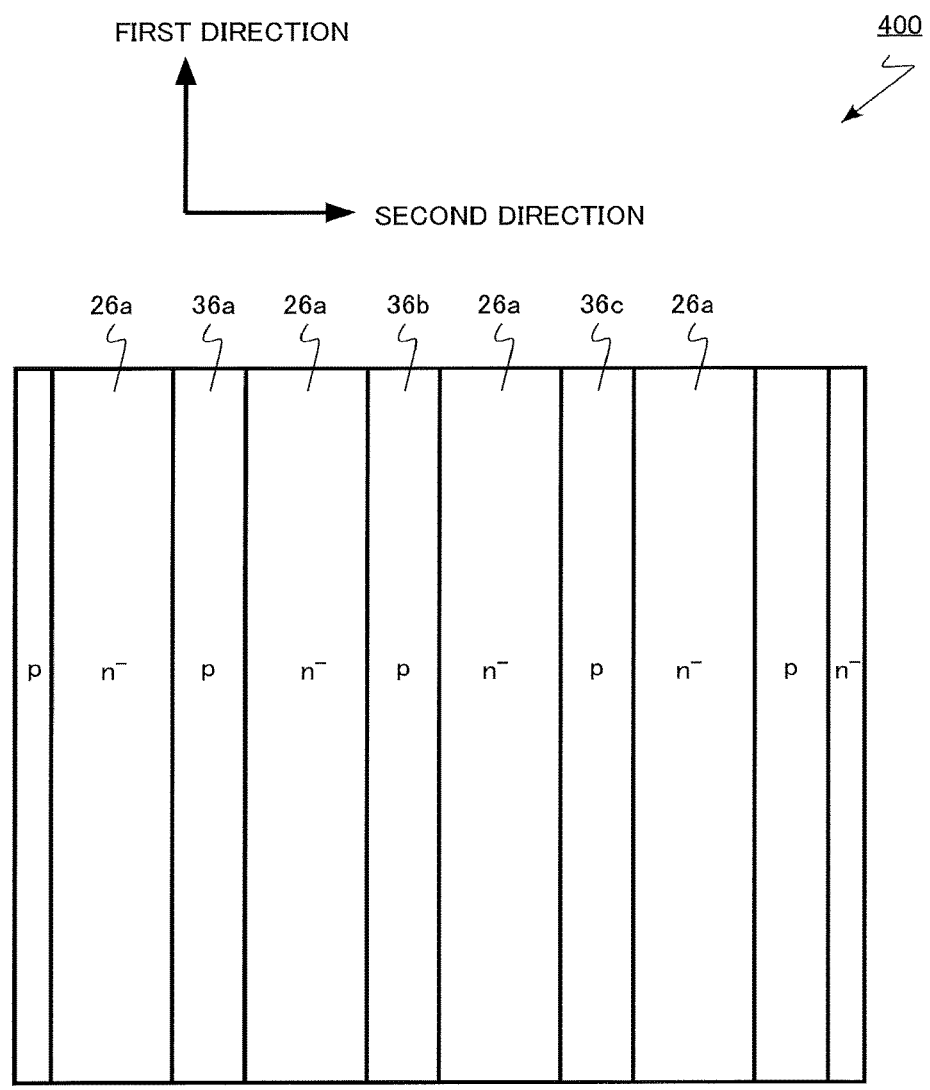
FIG. 10 is a schematic plan view of the semiconductor device according to the fourth embodiment.

FIG. 10 is a schematic plan view of the semiconductor device according to this embodiment. FIG. 10 is a plan view of a plane Py of FIG. 9.

The MOSFET 400 includes a p-type first intermediate region 36a (fifth silicon carbide region) located in a drift region 26, a p-type second intermediate region 36b (sixth silicon carbide region), and a p-type third intermediate region 36c (seventh silicon carbide region).

The first intermediate region 36a, the second intermediate region 36b, and the third intermediate region 36c extend in the first direction. The first intermediate region 36a, the second intermediate region 36b, and the third intermediate region 36c are separated from each other.

The first intermediate region 36a is located between a first gate electrode 18a and a back surface of a silicon carbide layer 10. The first intermediate region 36a is located between a first current limiting region 34a and the back surface of the silicon carbide layer 10.

The second intermediate region 36b is located between a second source region 30b and the back surface of the silicon carbide layer 10. The second intermediate region 36b is located between the first current limiting region 34a and the back surface of the silicon carbide layer 10.

The third intermediate region 36c is located between a second gate electrode 18b and the back surface of the silicon carbide layer 10. The third intermediate region 36c is located between a second current limiting region 34b and the back surface of the silicon carbide layer 10.

The first intermediate region 36a, the second intermediate region 36b, and the third intermediate region 36c are fixed to the same source potential as a source electrode 12, for example.

A p-type impurity concentration of each of the first intermediate region 36a, the second intermediate region 36b, and the third intermediate region 36c is, for example, $1 \times 10^{17}$ cm$^{-3}$ to $1 \times 10^{20}$ cm$^{-3}$. The p-type impurity concentration is preferably $5 \times 10^{17}$ cm$^{-3}$ to $5 \times 10^{19}$ cm$^{-3}$ and more preferably $1 \times 10^{10}$ cm$^{-3}$ to $1 \times 10^{19}$ cm$^{-3}$. If the p-type impurity concentration is low, a large region is necessary. If the p-type impurity concentration is high, structural defects are likely to occur even when a method of forming the first intermediate region 36a, the second intermediate region 36b, and the third intermediate region 36c is epitaxial growth or ion implantation. Typically, the p-type impurity concentration is, for example, $4 \times 10^{18}$ cm$^{-3}$.

In the MOSFET 400, an on-current from a channel region of a side surface of a second trench 22b flows through the drift region 26 between the second intermediate region 36b and the third intermediate region 36c during an on-operation. In addition, a forward current flowing from a first diode region 32a to a drain electrode 14 flows through the drift region 26 between the first intermediate region 36a and the second intermediate region 36b during a reflux operation in which a reflux current flows.

According to the MOSFET 400 according to this embodiment, an n-type impurity concentration of the drift region 26 can be increased without sacrificing a breakdown voltage when a reverse bias is applied. In the case of this embodiment, the first intermediate region 36a, the second intermediate region 36b, and the third intermediate region 36c are inserted into almost an intermediate portion of a first low-concentration region 26a, so that the n-type impurity concentration of the drift region 26 can be almost doubled. Therefore, on-resistance can be further decreased. The on-resistance can be decreased to almost half. For example, if K of the same intermediate regions are inserted (K is an integer) and are divided by K, a concentration can be increased by K times and the on-resistance can be decreased to 1/K.

In addition, in this embodiment, a channel region is formed at only one side of the first trench 22a and the second trench 22b. Therefore, as compared with the case where channel regions are formed at both sides of the trenches, it is easy to dispose the first intermediate region 36a, the second intermediate region 36b, and the third intermediate region 36c so that a path of an on-current and a path of a forward current of a diode are not disturbed and concentration of the on-current can be avoided.

According to the MOSFET 400 according to this embodiment, a short circuit tolerance and reliability are improved, similar to the first embodiment. In addition, the on-resistance can be decreased.

Fifth Embodiment

A semiconductor device according to this embodiment is the same as the semiconductor device according to the fourth embodiment, except that the semiconductor device further includes a p-type eighth silicon carbide region located in a drift region, extending in a second direction parallel to a first plane and vertical to a first direction, and contacting a fifth silicon carbide region, a sixth silicon carbide region, and a seventh silicon carbide region; and a p-type ninth silicon carbide region located in the drift region, extending in the second direction, contacting the fifth silicon carbide region, the sixth silicon carbide region, and the seventh silicon carbide region, and separated from the eighth silicon carbide region. Hereinafter, description of contents overlapping with those of the fourth embodiment will be omitted.

Figure 11:
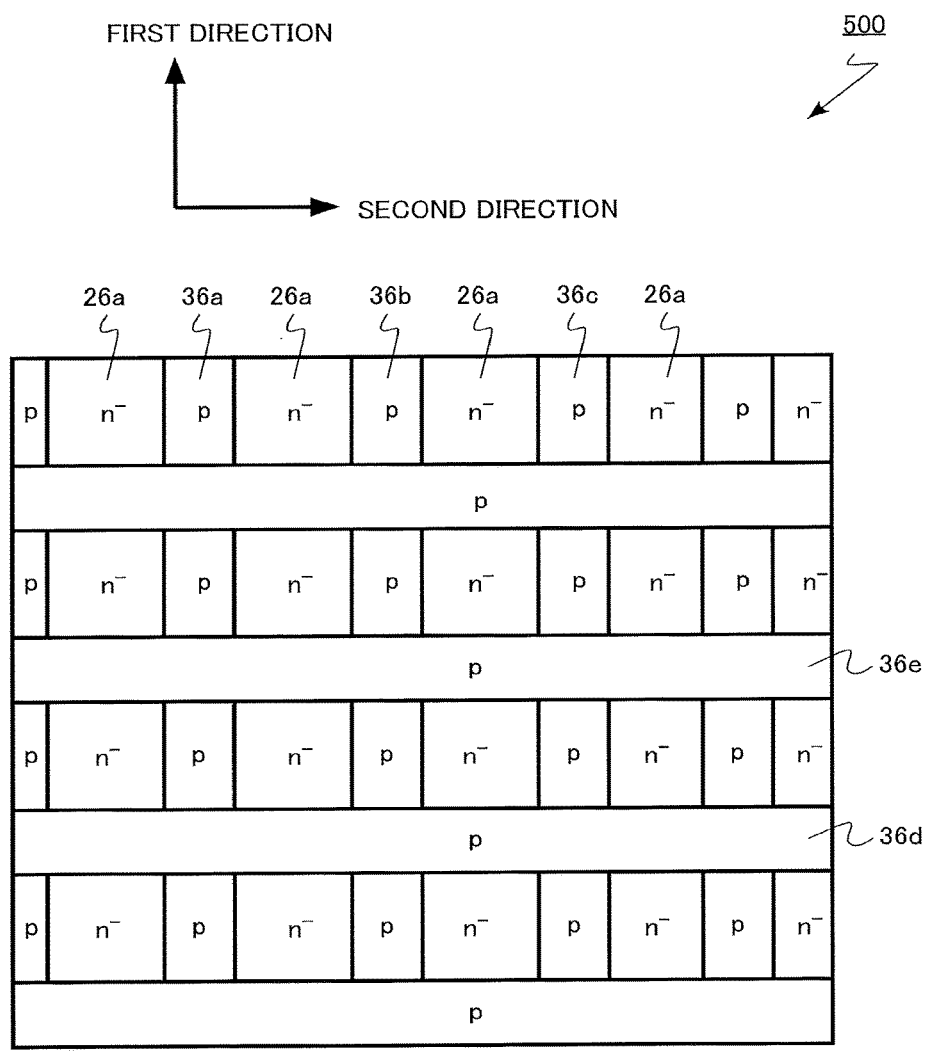
FIG. 11 is a schematic plan view of a semiconductor device according to a fifth embodiment.

FIG. 11 is a schematic plan view of the semiconductor device according to this embodiment. The semiconductor device according to this embodiment is a trench gate type vertical MOSFET 500 using silicon carbide. FIG. 11 is a plan view of a plane corresponding to a plane Py of FIG. 9.

The MOSFET 500 includes a p-type first intermediate region 36a (fifth silicon carbide region) located in a drift region 26, a p-type second intermediate region 36b (sixth silicon carbide region), a p-type third intermediate region 36c (seventh silicon carbide region), a p-type fourth intermediate region 36d (eighth silicon carbide region), and a p-type fifth intermediate region 36e (ninth silicon carbide region).

The fourth intermediate region 36d and the fifth intermediate region 36e extend in the second direction parallel to a surface of a silicon carbide layer 10 and vertical to the first direction. The fourth intermediate region 36d and the fifth intermediate region 36e are separated from each other.

The fourth intermediate region 36d and the fifth intermediate region 36e contact the first intermediate region 36a, the second intermediate region 36b, and the third intermediate region 36c. The fourth intermediate region 36d and the fifth intermediate region 36e cross the first intermediate region 36a, the second intermediate region 36b, and the third intermediate region 36c.

In the drift region 26, the first intermediate region 36a, the second intermediate region 36b, the third intermediate region 36c, the fourth intermediate region 36d, and the fifth intermediate region 36e form a mesh-like p-type region.

A p-type impurity concentration of each of the first intermediate region 36a, the second intermediate region 36b, the third intermediate region 36c, the fourth intermediate region 36d, and the fifth intermediate region 36e is, for example, $1\times10^{17}$ cm$^{-3}$ to $1\times10^{20}$ cm$^{-3}$. The p-type impurity concentration is preferably $5\times10^{17}$ cm$^{-3}$ to $5\times10^{19}$ cm$^{-3}$ and more preferably $1\times10^{18}$ cm$^{-3}$ to $1\times10^{19}$ cm$^{-3}$. If the p-type impurity concentration is low, a large region is necessary. If the p-type impurity concentration is high, structural defects are likely to occur even when a method of forming the first intermediate region 36a, the second intermediate region 36b, the third intermediate region 36c, the fourth intermediate region 36d, and the fifth intermediate region 36e is epitaxial growth or ion implantation. Typically, the p-type impurity concentration is, for example, $4\times10^{18}$ cm$^{-3}$.

According to the MOSFET 500 according to this embodiment, an n-type impurity concentration of the drift region 26 can be increased without sacrificing a breakdown voltage when a reverse bias is applied. In the case of this embodiment, the first intermediate region 36a, the second intermediate region 36b, the third intermediate region 36c, the fourth intermediate region 36d, and the fifth intermediate region 36e are inserted into almost an intermediate portion of a first low-concentration region 26a, so that the n-type impurity concentration of the drift region 26 can be almost doubled. Therefore, on-resistance can be further decreased. The on-resistance can be decreased to almost half. For example, if K of the same intermediate regions are inserted (K is an integer) and are divided by K, a concentration can be increased by K times and the on-resistance can be decreased to 1/K.

According to the MOSFET 500 according to this embodiment, a short circuit tolerance and reliability are improved, similar to the first embodiment. In addition, the on-resistance can be decreased.

Sixth Embodiment

A semiconductor device according to this embodiment is different from the semiconductor device according to the first embodiment in that the semiconductor device further includes a p-type tenth silicon carbide region which is located between a first silicon carbide region and a body region, is located between the first silicon carbide region and a second source region, contacts a source electrode, has a fifth n-type portion to be a part of a drift region between the first silicon carbide region and the p-type tenth silicon carbide region, a distance between a second plane and the p-type tenth silicon carbide region being smaller than a distance between the second plane and a first gate electrode, and has p-type impurity concentration higher than that of the body region and the fifth n-type portion to be the part of the drift region contacts the source electrode. Hereinafter, description of contents overlapping with those of the first embodiment will be omitted.

Figure 12:
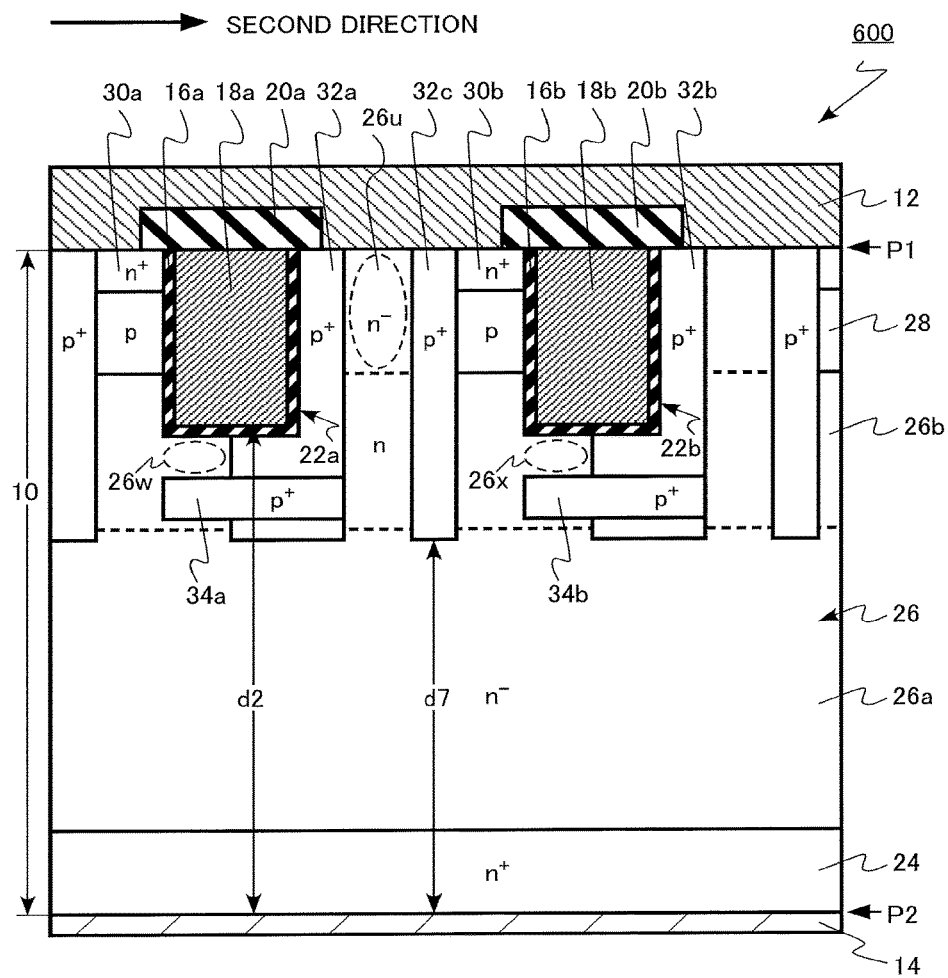
FIG. 12 is a schematic cross-sectional view of a semiconductor device according to a sixth embodiment.

FIG. 12 is a schematic cross-sectional view of the semiconductor device according to this embodiment. The semiconductor device according to this embodiment is a trench gate type vertical MOSFET 600 using silicon carbide. The MOSFET 600 includes a merged PiN Schottky (MPS) diode.

The MOSFET 600 includes a p$^+$-type third diode region 32c (tenth silicon carbide region). A drift region 26 of the MOSFET 600 includes an n$^-$-type junction field effect transistor (JFET) region 26u (fifth n-type portion).

The third diode region 32c is located between the drift region 26 and a body region 28. The third diode region 32c is located between a first diode region 32a and a second source region 30b. The third diode region 32c contacts a source electrode 12.

A distance (d7 of FIG. 12) between a back surface of a silicon carbide layer 10 and the third diode region 32c is smaller than a distance (d2 of FIG. 12) between the back surface of the silicon carbide layer 10 and a first gate electrode 18a. Depths of the third diode region 32c and the first diode region 32a are substantially the same. The depth of the third diode region 32c is larger than a depth of an end portion of a first gate insulating layer 16a at the back surface side of the silicon carbide layer 10.

A p-type impurity concentration of the third diode region 32c is higher than a p-type impurity concentration of the body region 28. The p-type impurity concentration is, for example, $1 \times 10^{18}$ cm$^{-3}$ to $1 \times 10^{21}$ cm$^{-3}$. Typically, the p-type impurity concentration is, for example, $1 \times 10^{19}$ cm$^{-3}$.

The JFET region 26u is provided between the third diode region 32c and the first diode region 32a. The JFET region 26u is a part of the drift region 26. The JFET region 26u contacts the source electrode 12. A junction between the JFET region 26u and the source electrode 12 is a Schottky junction.

The first diode region 32a, the third diode region 32c, the JFET region 26u, the source electrode 12, and the drain electrode 14 configure the MPS diode. The source electrode 12 functions as an anode electrode of the MPS diode and the drain electrode 14 functions as a cathode electrode of the MPS diode. The MPS diode functions as a freewheel diode.

Since the MOSFET 600 includes the MPS diode as the freewheel diode, a high-speed and low-loss operation is enabled.

According to the MOSFET 600 according to this embodiment, a short circuit tolerance and reliability are improved, similar to the first embodiment. In addition, the high-speed and low-loss operation is enabled.

Seventh Embodiment

A semiconductor device according to this embodiment is the same as the semiconductor device according to the sixth embodiment, except that the semiconductor device further includes a p-type fifth silicon carbide region which is located in a drift region, is located between a first gate electrode and a second plane, and extends in a first direction, a p-type sixth silicon carbide region which is located in the drift region, is located between a second source region and the second plane, is located between a third silicon carbide region and the second plane, and extends in the first direction, and a p-type seventh silicon carbide region which is located in the drift region, is located between a second gate electrode and the second plane, and extends in the first direction. Hereinafter, description of contents overlapping with those of the first embodiment will be omitted.

Figure 13:
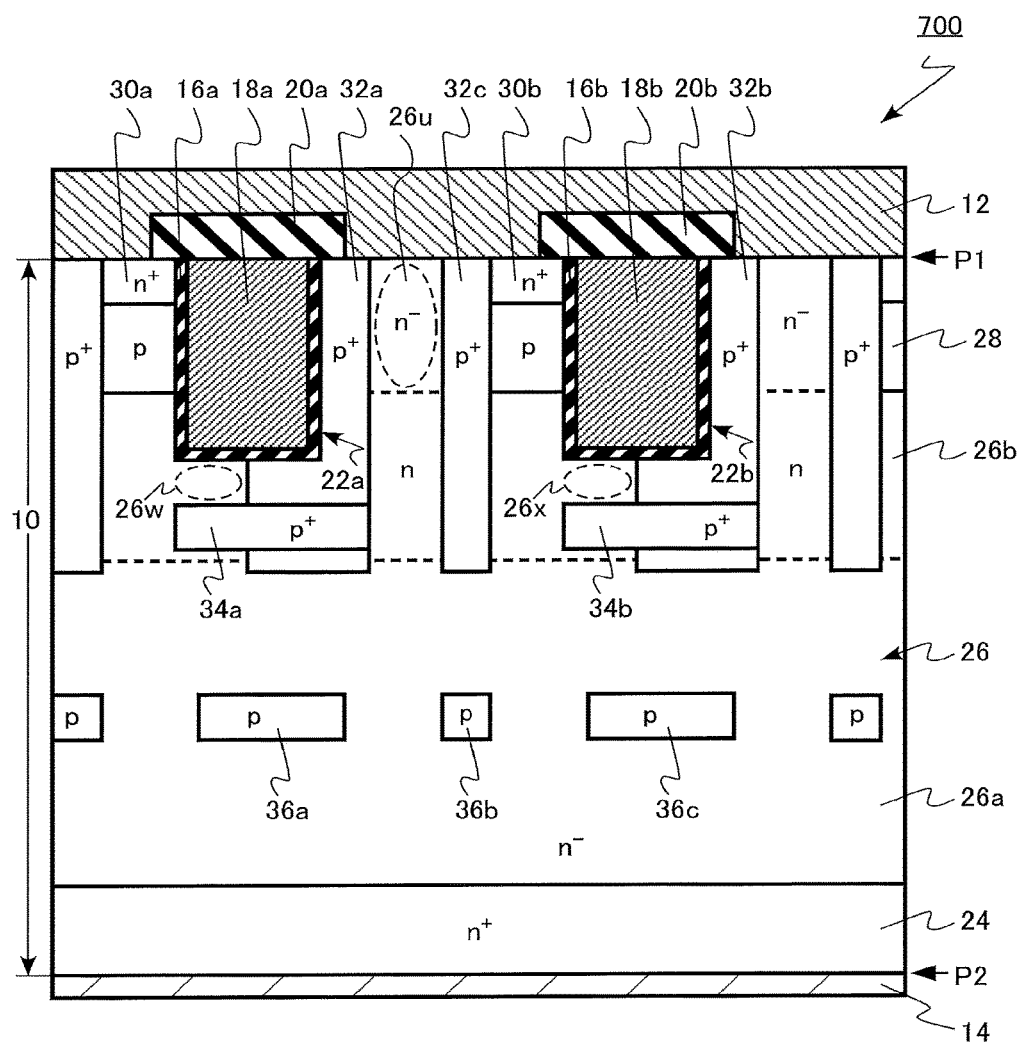
FIG. 13 is a schematic cross-sectional view of a semiconductor device according to a seventh embodiment.

FIG. 13 is a schematic cross-sectional view of the semiconductor device according to this embodiment. The semiconductor device according to this embodiment is a trench gate type vertical MOSFET 700 using silicon carbide. The MOSFET 700 includes an MPS diode.

The MOSFET 700 includes a p-type first intermediate region 36a (fifth silicon carbide region) located in a drift region 26, a p-type second intermediate region 36b (sixth silicon carbide region), and a p-type third intermediate region 36c (seventh silicon carbide region).

The first intermediate region 36a, the second intermediate region 36b, and the third intermediate region 36c extend in the first direction. The first intermediate region 36a, the second intermediate region 36b, and the third intermediate region 36c are separated from each other.

The first intermediate region 36a is located between a first gate electrode 18a and a back surface of a silicon carbide layer 10. The first intermediate region 36a is located between a first current limiting region 34a and the back surface of the silicon carbide layer 10.

The second intermediate region 36b is located between a third diode region 32c and the back surface of the silicon carbide layer 10.

The third intermediate region 36c is located between a second gate electrode 18b and the back surface of the silicon carbide layer 10. The third intermediate region 36c is located between a second current limiting region 34b and the back surface of the silicon carbide layer 10.

The first intermediate region 36a, the second intermediate region 36b, and the third intermediate region 36c are fixed to the same source potential as a source electrode 12, for example.

A p-type impurity concentration of each of the first intermediate region 36a, the second intermediate region 36b, and the third intermediate region 36c is, for example, $1 \times 10^{17}$ cm$^{-3}$ to $1 \times 10^{20}$ cm$^{-3}$. The p-type impurity concentration is preferably $5 \times 10^{17}$ cm$^{-3}$ to $5 \times 10^{19}$ cm$^{-3}$ and more preferably $1 \times 10^{18}$ cm$^{-3}$ to $1 \times 10^{19}$ cm$^{-3}$. If the p-type impurity concentration is low, a large region is necessary. If the p-type impurity concentration is high, structural defects are likely to occur even when a method of forming the first intermediate region 36a, the second intermediate region 36b, and the third intermediate region 36c is epitaxial growth or ion implantation. Typically, the p-type impurity concentration is $4 \times 10^{18}$ cm$^{-3}$.

According to the MOSFET 700 according to this embodiment, an n-type impurity concentration of the drift region 26 can be increased without sacrificing a breakdown voltage when a reverse bias is applied. In the case of this embodiment, the first intermediate region 36a, the second intermediate region 36b, and the third intermediate region 36c are inserted into almost an intermediate portion of a first low-concentration region 26a, so that the n-type impurity concentration of the drift region 26 can be almost doubled. Therefore, on-resistance can be further decreased. The on-resistance can be decreased to almost half. For example, if K of the same intermediate regions are inserted (K is an integer) and are divided by K, a concentration can be increased by K times and the on-resistance can be decreased to 1/K.

According to the MOSFET 700 according to this embodiment, a short circuit tolerance and reliability are improved, similar to the sixth embodiment. In addition, a high-speed and low-loss operation is enabled. In addition, the on-resistance can be decreased.

Eighth Embodiment

A semiconductor device according to this embodiment includes: a silicon carbide layer having a first plane and a second plane; a source electrode contacting the first plane; a drain electrode contacting the second plane; a first gate electrode located between the source electrode and the drain electrode and extending in a first direction parallel to the first plane; a second gate electrode located between the source electrode and the drain electrode and extending in the first direction parallel to the first plane; an n-type drift region located in the silicon carbide layer; a p-type body region located in the silicon carbide layer and located between the drift region and the first plane; an n-type first source region located in the silicon carbide layer, located between the body region and the first plane, and contacting the source electrode; an n-type second source region located in the silicon carbide layer, located between the body region and the first plane, and contacting the source electrode, the first gate electrode being located between the first source region and the second source region; a p-type first silicon carbide region located in the silicon carbide layer, located between the drift region and the first plane, contacting the source electrode, a distance between the second plane and the first silicon carbide region being smaller than a distance between the second plane and the first gate electrode, the first gate electrode being located between the first source region and the first silicon carbide region, located between the first gate electrode and the body region, and having a p-type impurity concentration higher than a p-type impurity concentration of the body region; a p-type second silicon carbide region located in the silicon carbide layer, located between the drift region and the first plane, contacting the source electrode, a distance between the second plane and the second silicon carbide region being smaller than a distance between the second plane and the second gate electrode, the second gate electrode being located between the second source region and the second silicon carbide region, located between the second gate electrode and the body region, and having a p-type impurity concentration higher than the p-type impurity concentration of the body region; a first gate insulating layer located between the first gate electrode and the drift region, between the first gate electrode and the body region, between the first gate electrode and the first silicon carbide region, and between the first gate electrode and the first source region; a second gate insulating layer located between the second gate electrode and the drift region, between the second gate electrode and the body region, between the second gate electrode and the second silicon carbide region, and between the second gate electrode and the second source region; a p-type third silicon carbide region located in the silicon carbide layer, extending in a second direction parallel to the first plane and vertical to the first direction, located between the second plane and the first gate electrode, located between the second plane and the second gate electrode, and contacting the first silicon carbide region and the second silicon carbide region, a first n-type portion to be a part of the drift region being located between the first gate insulating layer and the third silicon carbide region, a second n-type portion to be a part of the drift region being located between the second gate insulating layer and the third silicon carbide region; and a p-type fourth silicon carbide region located in the silicon carbide layer, extending in the second direction, located between the second plane and the first gate electrode, located between the second plane and the second gate electrode, contacting the first silicon carbide region and the second silicon carbide region, a third n-type portion to be a part of the drift region being located between the first gate insulating layer and the fourth silicon carbide region, a fourth n-type portion to be a part of the drift region being located between the second gate insulating layer and the fourth silicon carbide region, and separated from the third silicon carbide region. The semiconductor device according to this embodiment is different from the semiconductor device according to the first embodiment in that the extension direction of the third silicon carbide region and the fourth silicon carbide region is not the first direction but the second direction. Hereinafter, description of contents overlapping with those of the first embodiment will be omitted.

Figure 14:
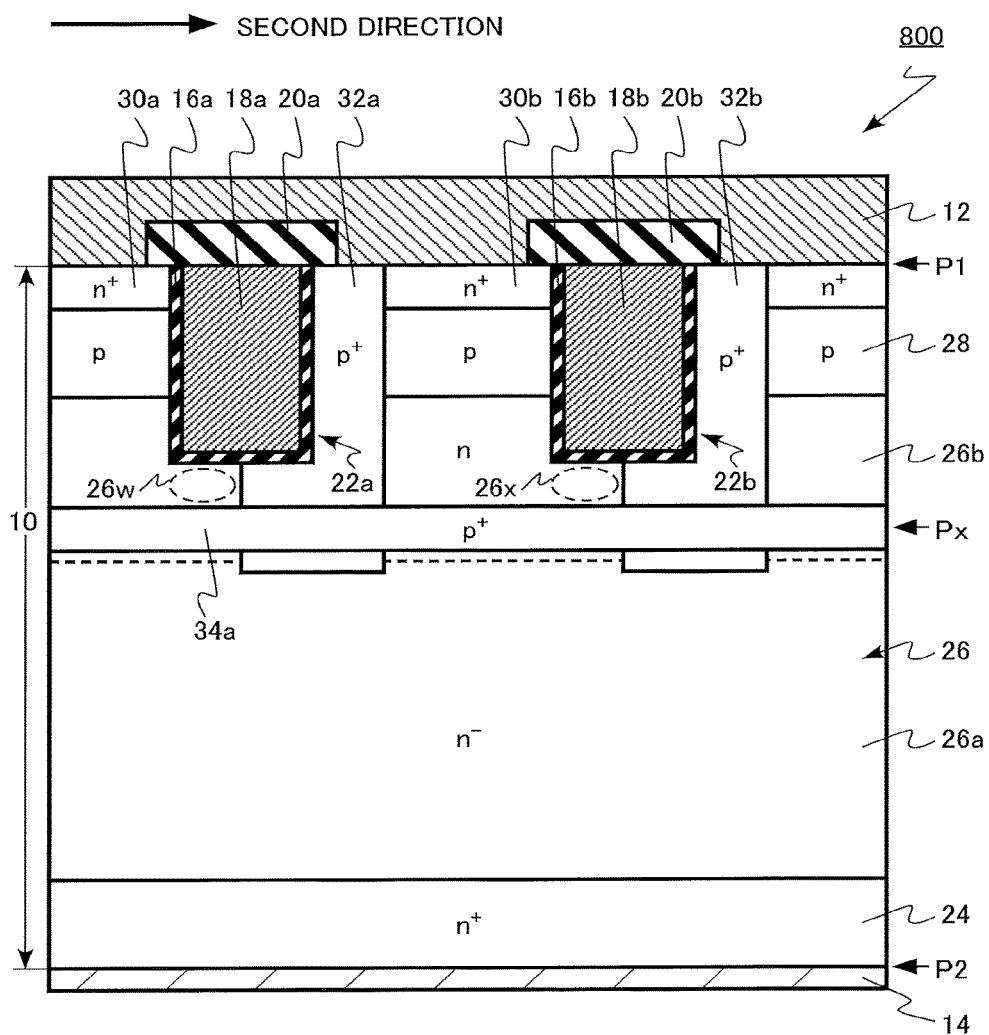
FIG. 14 is a schematic cross-sectional view of a semiconductor device according to an eighth embodiment.

FIG. 14 is a schematic cross-sectional view of the semiconductor device according to this embodiment. The semiconductor device according to this embodiment is a trench gate type vertical MOSFET 800 using silicon carbide.

Figure 15:
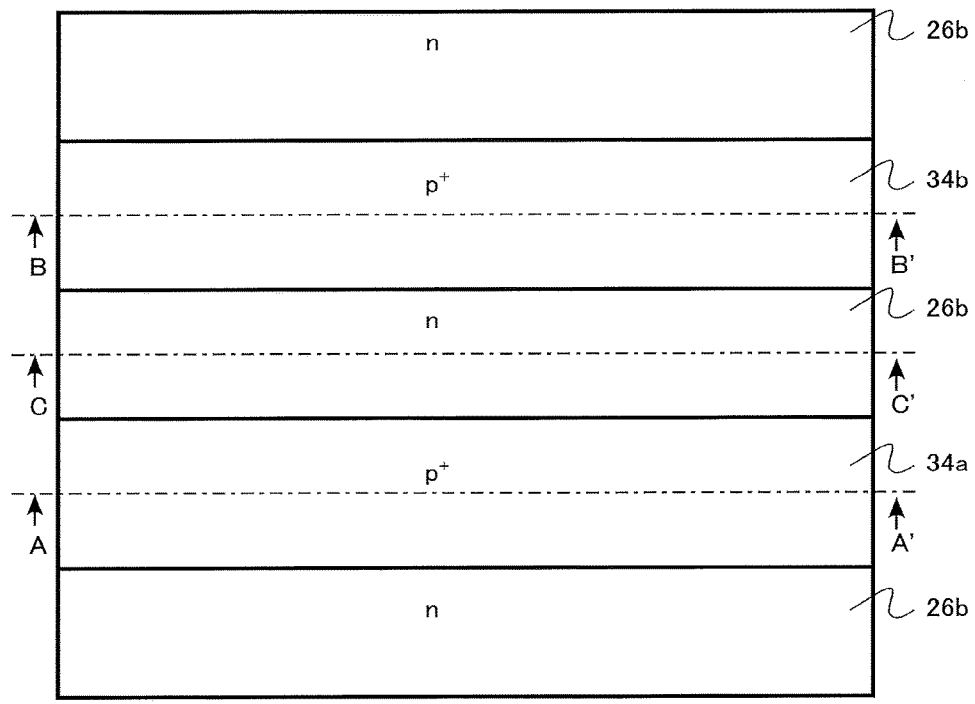
FIG. 15 is a schematic plan view of the semiconductor device according to the eighth embodiment.

FIG. 15 is a schematic plan view of the semiconductor device according to this embodiment. FIG. 15 is a plan view of a plane Px of FIG. 14. FIG. 14 is a cross-sectional view taken along the line AA' of FIG. 15.

Figure 16:
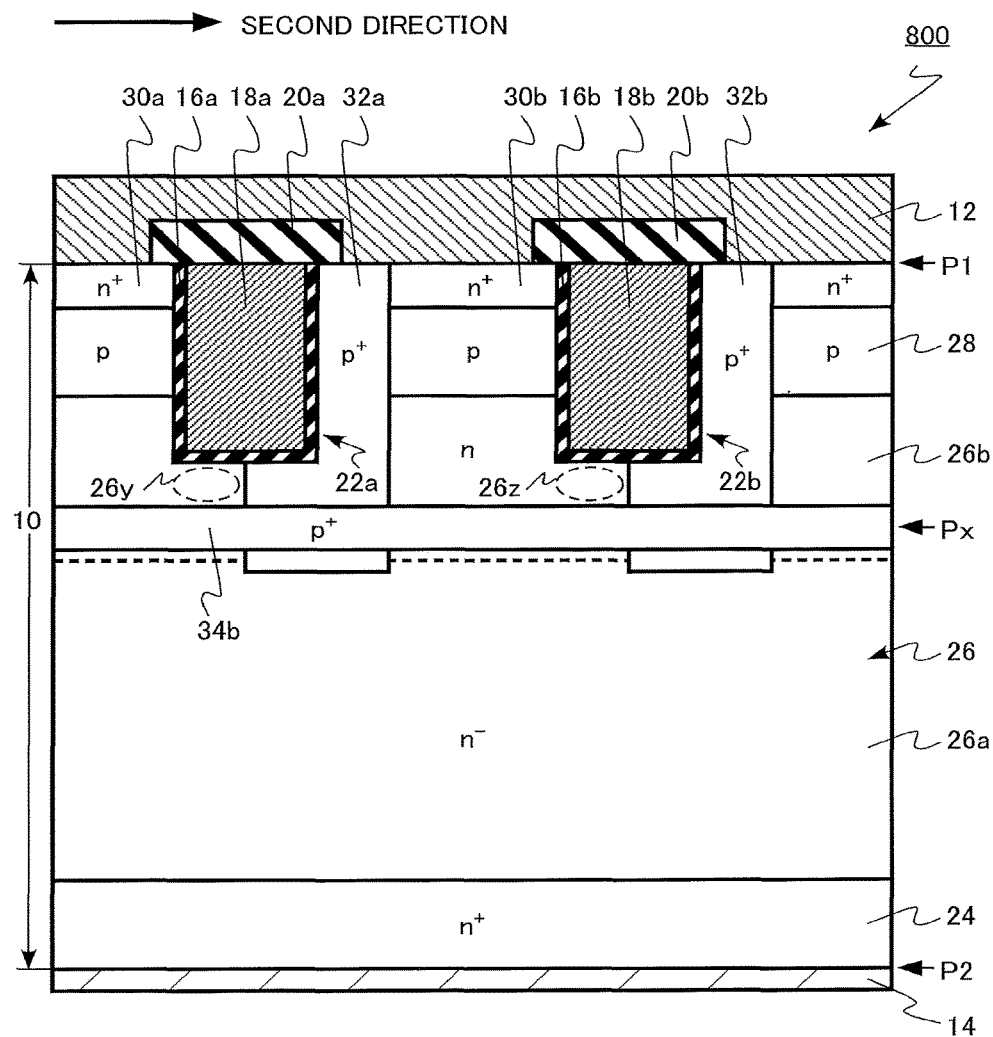
FIG. 16 is a schematic cross-sectional view of the semiconductor device according to the eighth embodiment.
Figure 17:
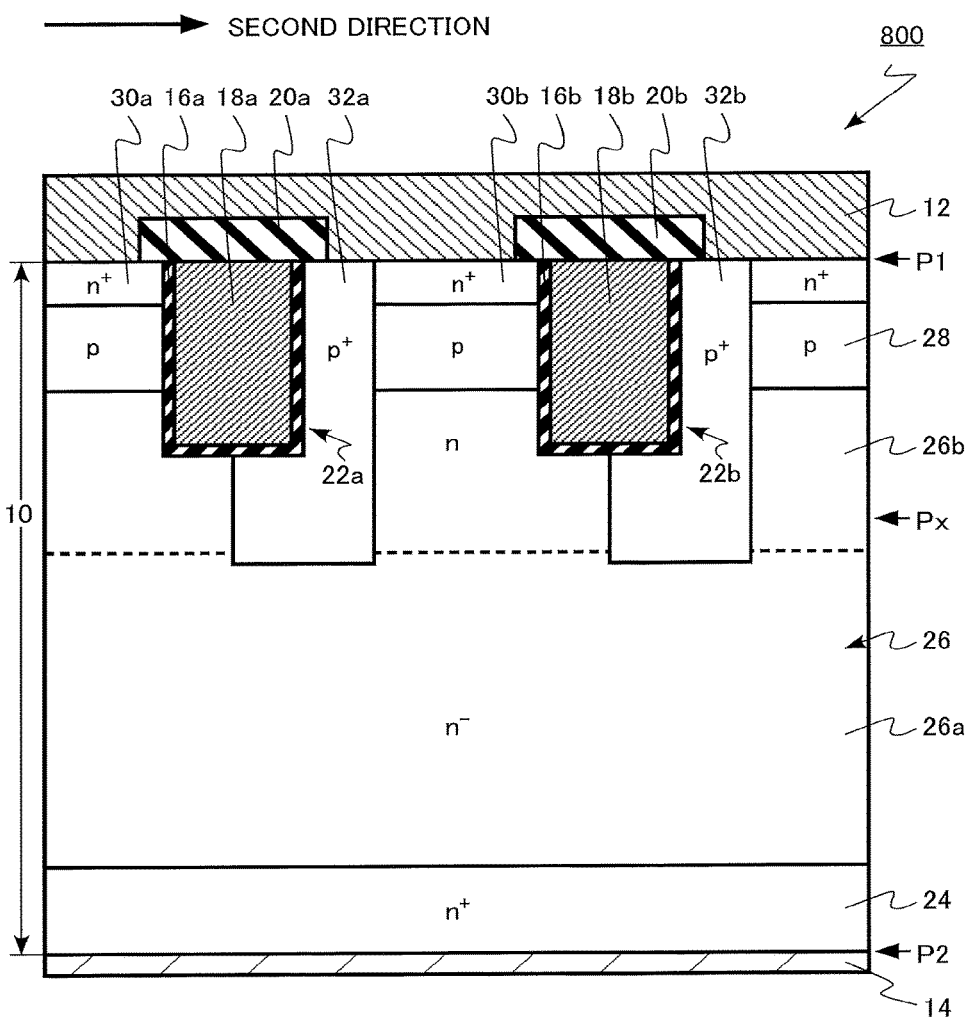
FIG. 17 is a schematic cross-sectional view of the semiconductor device according to the eighth embodiment.

FIGS. 16 and 17 are schematic cross-sectional views of the semiconductor device according to this embodiment. FIG. 16 is a cross-sectional view taken along the line BB' of FIG. 15. FIG. 17 is a cross-sectional view taken along the line CC' of FIG. 15.

In a silicon carbide layer 10 of the MOSFET 800, a p$^+$-type first current limiting region 34a (third silicon carbide region) and a p$^+$-type second current limiting region 34b (fourth silicon carbide region) are located.

A n$^-$-type or n-type drift region 26 has a first low-concentration region 26a (first n-type region), a high-concentration region 26b (second n-type region), a first field alleviation portion 26w (first n-type portion), a second field alleviation portion 26x (second n-type portion), a third field alleviation portion 26y (third n-type portion), and a fourth field alleviation portion 26z (fourth n-type portion).

The first current limiting region 34a and the second current limiting region 34b extend in the second direction orthogonal to the first direction. The first current limiting region 34a and the second current limiting region 34b are provided in a direction orthogonal to a first gate electrode 18a and a second gate electrode 18b. The first current limiting region 34a and the second current limiting region 34b contact a first diode region 32a and a second diode region 32b.

The first field alleviation portion 26w is located between the first current limiting region 34a and the first gate electrode 18a. The first field alleviation portion 26w is located between the first current limiting region 34a and the first gate insulating layer 16a. The first field alleviation portion 26w is a part of the drift region 26. The first field alleviation portion 26w is located in the n-type high-concentration region 26b.

The second field alleviation portion 26x is located between the first current limiting region 34a and the second gate electrode 18b. The second field alleviation portion 26x is located between the first current limiting region 34a and a second gate insulating layer 16b. The second field alleviation portion 26x is a part of the drift region 26. The second field alleviation portion 26x is located in the n-type high-concentration region 26b.

The third field alleviation portion 26y is located between the second current limiting region 34b and the first gate electrode 18a. The third field alleviation portion 26y is located between the second current limiting region 34b and the first gate insulating layer 16a. The third field alleviation portion 26y is a part of the drift region 26. The third field alleviation portion 26y is located in the n-type high-concentration region 26b.

The fourth field alleviation portion 26z is located between the second current limiting region 34b and the second gate electrode 18b. The fourth field alleviation portion 26z is located between the second current limiting region 34b and the second gate insulating layer 16b. The fourth field alleviation portion 26z is a part of the drift region 26. The fourth field alleviation portion 26z is located in the n-type high-concentration region 26b.

The first current limiting region 34a and the second current limiting region 34b are provided in a direction orthogonal to the first gate electrode 18a and the second gate electrode 18b. Therefore, even if misalignment occurs between the first current limiting region 34a and the second current limiting region 34b and the first gate electrode 18a and the second gate electrode 18b, at the time of manufacturing the MOSFET 800, the influence on characteristics of the MOSFET 800 is small. Therefore, a characteristic variation caused by the misalignment at the time of manufacturing can be suppressed.

According to the MOSFET 800 according to this embodiment, similar to the first embodiment, heat generation at the time of load short circuiting is suppressed and a short circuit tolerance is improved. In addition, a breakdown voltage of the gate insulating layer is improved and reliability is improved. In addition, the characteristic variation caused by the misalignment at the time of manufacturing can be suppressed.

Ninth Embodiment

A drive device according to this embodiment is a drive device including the semiconductor device according to the first embodiment.

Figure 18:
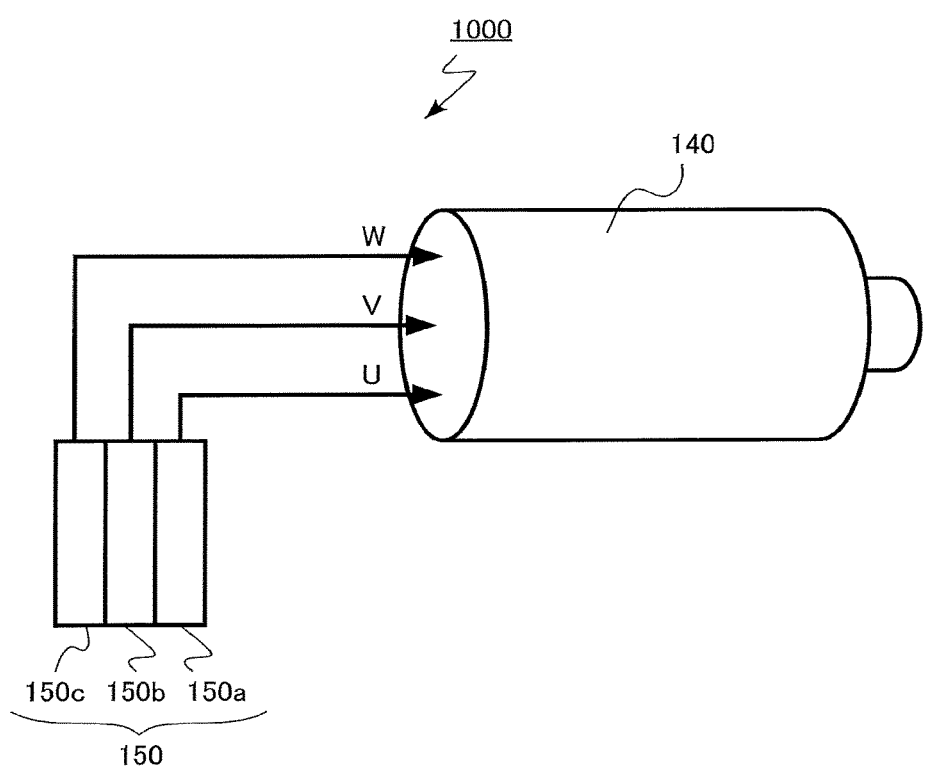
FIG. 18 is a schematic diagram of a drive device according to a ninth embodiment.

FIG. 18 is a schematic diagram of the drive device according to this embodiment. A drive device 1000 includes a motor 140 and an inverter circuit 150.

The inverter circuit 150 is composed of three semiconductor modules 150a, 150b, and 150c using the MOSFET 100 according to the first embodiment as a switching element. By connecting the three semiconductor modules 150a, 150b, and 150c in parallel, the three-phase inverter circuit 150 having three AC voltage output terminals U, V, and W is realized. The motor 140 is driven by an AC voltage output from the inverter circuit 150.

According to this embodiment, characteristics of the inverter circuit 150 and the drive device 1000 are improved by including the MOSFET 100 having improved characteristics.

Tenth Embodiment

A vehicle according to this embodiment is a vehicle including the semiconductor device according to the first embodiment.

Figure 19:
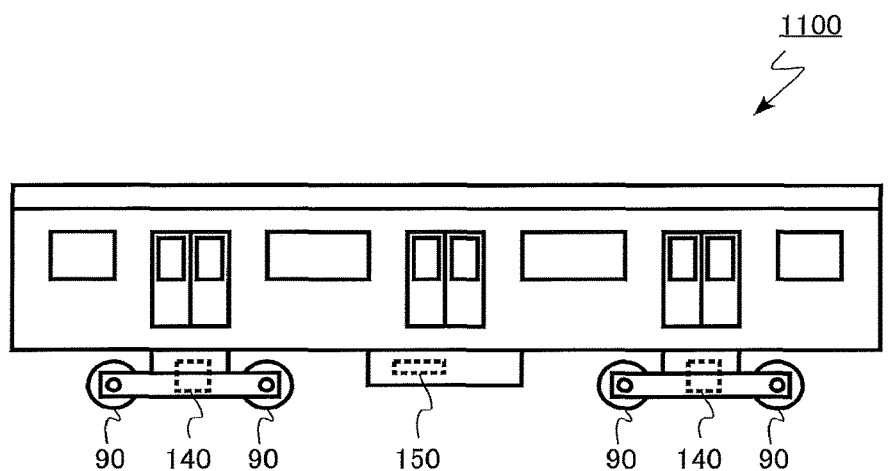
FIG. 19 is a schematic diagram of a vehicle according to a tenth embodiment.

FIG. 19 is a schematic diagram of the vehicle according to this embodiment. A vehicle 1100 according to this embodiment is a railroad vehicle. The vehicle 1100 includes motors 140 and an inverter circuit 150.

The inverter circuit 150 is composed of three semiconductor modules using the MOSFET 100 according to the first embodiment as a switching element. By connecting the three semiconductor modules in parallel, the three-phase inverter circuit 150 having three AC voltage output terminals U, V, and W is realized. The motor 140 is driven by an AC voltage output from the inverter circuit 150. Wheels 90 of the vehicle 1100 are rotated by the motor 140.

According to this embodiment, characteristics of the vehicle 1100 are improved by including the MOSFET 100 having improved characteristics.

Eleventh Embodiment

A vehicle according to this embodiment is a vehicle including the semiconductor device according to the first embodiment.

Figure 20:
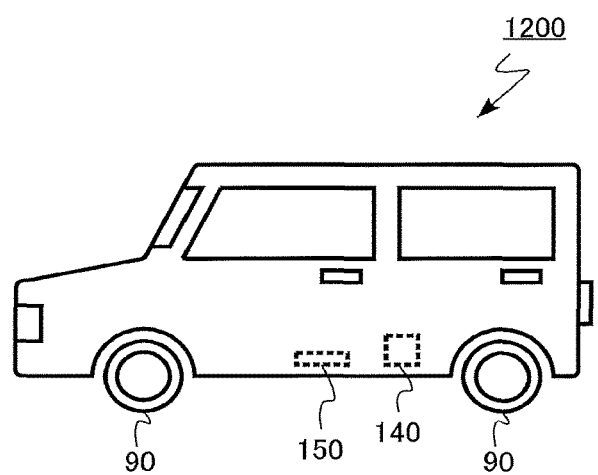
FIG. 20 is a schematic diagram of a vehicle according to an eleventh embodiment.

FIG. 20 is a schematic diagram of the vehicle according to this embodiment. A vehicle 1200 according to this embodiment is an automobile. The vehicle 1200 includes a motor 140 and an inverter circuit 150.

The inverter circuit 150 is composed of three semiconductor modules using the MOSFET 100 according to the first embodiment as a switching element. By connecting the three semiconductor modules in parallel, the three-phase inverter circuit 150 having three AC voltage output terminals U, V, and W is realized.

The motor 140 is driven by an AC voltage output from the inverter circuit 150. Wheels 90 of the vehicle 1200 are rotated by the motor 140.

According to this embodiment, characteristics of the vehicle 1200 are improved by including the MOSFET 100 having improved characteristics.

Twelfth Embodiment

An elevator according to this embodiment is an elevator including the semiconductor device according to the first embodiment.

Figure 21:
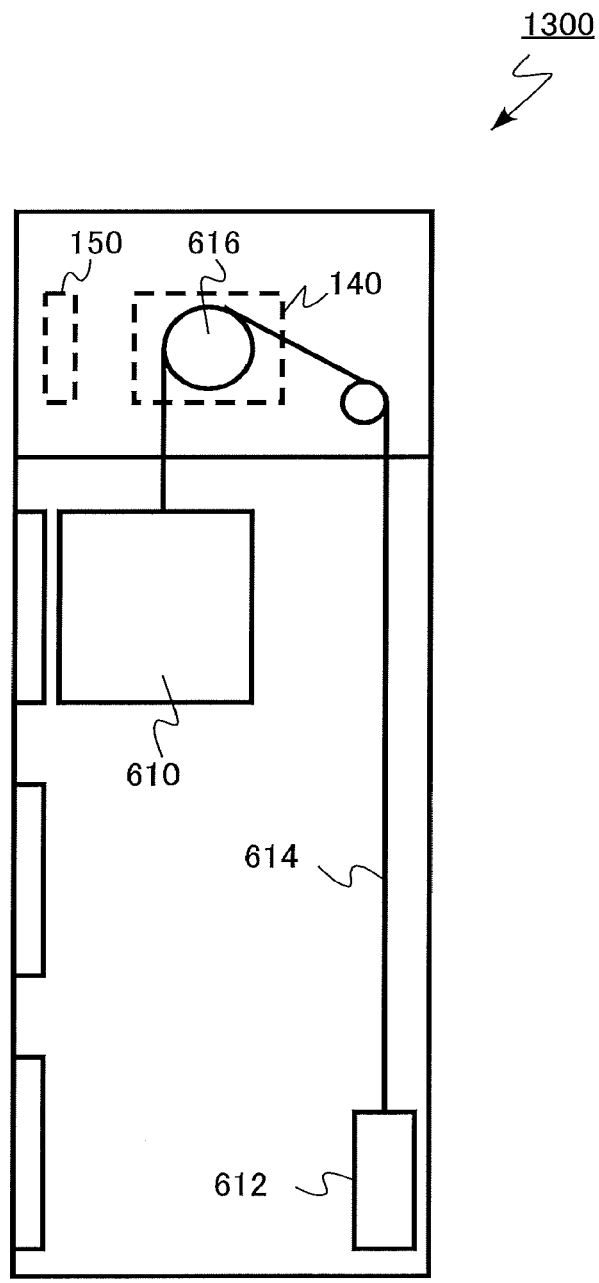
FIG. 21 is a schematic diagram of an elevator according to a twelfth embodiment.

FIG. 21 is a schematic diagram of the elevator according to this embodiment. An elevator 1300 according to this embodiment includes a car 610, a counter weight 612, a wire rope 614, a winding machine 616, a motor 140, and an inverter circuit 150.

The inverter circuit 150 is composed of three semiconductor modules using the MOSFET 100 according to the first embodiment as a switching element. By connecting the three semiconductor modules in parallel, the three-phase inverter circuit 150 having three AC voltage output terminals U, V, and W is realized.

The motor 140 is driven by an AC voltage output from the inverter circuit 150. The winding machine 616 is rotated by the motor 140 and the car 610 is elevated.

According to this embodiment, characteristics of the elevator 1300 are improved by including the MOSFET 100 having improved characteristics.

In the embodiments, the case where 4H—SiC is used as a crystal structure of silicon carbide has been described as an example. However, the present disclosure can be applied to silicon carbide of other crystal structure such as 6H—SiC and 3C—SiC.

In addition, in the tenth to twelfth embodiments, the case where the semiconductor device according to the first embodiment is included has been described as an example. However, the semiconductor device according to any one of the first to eighth embodiments can be applied.

In addition, in the tenth to twelfth embodiments, the case where the semiconductor device according to the present disclosure is applied to the vehicle or the elevator has been described as an example. However, the semiconductor device according to the present disclosure can be applied to a power conditioner of a photovoltaic power generation system and the like.

While certain embodiments have been described, these embodiments have been presented by way of example only and are not intended to limit the range of the invention. These novel embodiments may be embodied in a variety of other forms and various omissions, substitutions, and changes can be made without departing from the scope of the invention. For example, the components according to one embodiment may be replaced or changed by or to the components according to another embodiment. These embodiments or modifications are included in the range or the scope of the invention and are included in a range of the accompanying claims and their equivalents.

While certain embodiments have been described, these embodiments have been presented by way of example only, and are not intended to limit the scope of the inventions. Indeed, a semiconductor device, an inverter circuit, a drive device, a vehicle, and an elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a silicon carbide layer having a first plane and a second plane;
    a source electrode contacting the first plane;
    a drain electrode contacting the second plane;
    a first gate electrode located between the source electrode and the drain electrode;
    a second gate electrode located between the source electrode and the drain electrode;
    an n-type drift region located in the silicon carbide layer, the n-type drift region including a first n-type portion and a second n-type portion;
    a p-type body region located in the silicon carbide layer and located between the n-type drift region and the first plane;
    an n-type first source region located in the silicon carbide layer, the n-type first source region located between the p-type body region and the first plane, and the n-type first source region contacting the source electrode;
    an n-type second source region located in the silicon carbide layer, the n-type second source region located between the p-type body region and the first plane, the re-type second source region contacting the source electrode, and the first gate electrode being located between the n-type first source region and the n-type second source region;
    a p-type first silicon carbide region located in the silicon carbide layer, the p-type first silicon carbide region located between the n-type drift region and the first plane, the p-type first silicon carbide region contacting the source electrode, a distance between the second plane and the p-type first silicon carbide region being smaller than a distance between the second plane and the first gate electrode, the first gate electrode being located between the n-type first source region and the p-type first silicon carbide region, the p-type first silicon carbide region located between the first gate electrode and the p-type body region, and the p-type first silicon carbide region having a p-type impurity concentration higher than a p-type impurity concentration of the p-type body region;
    a p-type second silicon carbide region located in the silicon carbide layer, the p-type second silicon carbide region located between the n-type drift region and the first plane, the p-type second silicon carbide region contacting the source electrode, a distance between the second plane and the p-type second silicon carbide region being smaller than a distance between the second plane and the second gate electrode, the second gate electrode being located between the n-type second source region and the p-type second silicon carbide region, the p-type second silicon carbide region located between the second gate electrode and the p-type body region, and the p-type second silicon carbide region having a p-type impurity concentration higher than the p-type impurity concentration of the p-type body region;
    a first gate insulating layer located between the first gate electrode and the n-type drift region, between the first gate electrode and the p-type body region, between the first gate electrode and the p-type first silicon carbide region, and between the first gate electrode and the n-type first source region;
    a second gate insulating layer located between the second gate electrode and the n-type drift region, between the second gate electrode and the p-type body region, between the second gate electrode and the p-type second silicon carbide region, and between the second gate electrode and the n-type second source region;
    a p-type third silicon carbide region located in the silicon carbide layer, the p-type third silicon carbide region located between the second plane and the first gate electrode, the p-type third silicon carbide region contacting the p-type first silicon carbide region, the first n-type portion being located between the first gate insulating layer and the p-type third silicon carbide region; and
    a p-type fourth silicon carbide region located in the silicon carbide layer, the p-type fourth silicon carbide region located between the second plane and the second gate electrode, the p-type fourth silicon carbide region contacting the p-type second silicon carbide region, the second n-type portion being located between the second gate insulating layer and the p-type fourth silicon carbide region, and the p-type fourth silicon carbide region separated from the p-type third silicon carbide region.

2. The semiconductor device according to claim 1, wherein a distance between the p-type third silicon carbide region and the first gate insulating layer and a distance between the p-type fourth silicon carbide region and the second gate insulating layer are 0.05 µm to 0.2 µm.

3. The semiconductor device according to claim 1, wherein
    the n-type drift region has a first n-type region and a second n-type region located between the first n-type region and the p-type body region, the second n-type region having an impurity concentration higher than an impurity concentration of the first n-type region,
    wherein the first n-type portion and the second n-type portion are located in the second n-type region.

4. The semiconductor device according to claim 3, wherein an n-type impurity concentration of the second n-type region is $2\times10^{17}$ cm$^{-3}$ to $1\times10^{19}$ cm$^{-3}$.

5. The semiconductor device according to claim 3, wherein the n-type drift region further includes a third n-type region, the third n-type region located between the second n-type region and the p-type body region, the third n-type region having an n-type impurity concentration lower than an n-type impurity concentration of the second n-type region.

6. The semiconductor device according to claim 1, wherein the p-type body region has a first p-type region and a second p-type region located between the first p-type region and the n-type drift region, and the second p-type region having a p-type impurity concentration higher than a p-type impurity concentration of the first p-type region.

7. The semiconductor device according to claim 1, wherein a distance between the p-type third silicon carbide region and the p-type fourth silicon carbide region is smaller than a distance between the p-type first silicon carbide region and the p-type second gate insulating layer.

8. The semiconductor device according to claim 1, wherein a distance between the second plane and the p-type first silicon carbide region is smaller than a distance between the second plane and the p-type third silicon carbide region, and a distance between the second plane and the p-type second silicon carbide region is smaller than a distance between the second plane and the p-type fourth silicon carbide region.

9. The semiconductor device according to claim 1, wherein the first gate electrode and the second gate electrode extend in a first direction parallel to the first plane, and the p-type third silicon carbide region and the p-type fourth silicon carbide region extend in the first direction.

10. The semiconductor device according to claim 1, further comprising:
a p-type fifth silicon carbide region located in the n-type drift region, the p-type fifth silicon carbide region located between the first gate electrode and the second plane, and the p-type fifth silicon carbide region extending in a first direction parallel to the first plane;
a p-type sixth silicon carbide region located in the n-type drift region, the p-type sixth silicon carbide region located between the second source region and the second plane, the p-type sixth silicon carbide region located between the p-type third silicon carbide region and the second plane, and the p-type sixth silicon carbide region extending in the first direction; and
a p-type seventh silicon carbide region located in the n-type drift region, the p-type seventh silicon carbide region located between the second gate electrode and the second plane, and the p-type seventh silicon carbide region extending in the first direction.

11. The semiconductor device according to claim 10, further comprising:
a p-type eighth silicon carbide region located in the n-type drift region, the p-type eighth silicon carbide region extending in a second direction parallel to the first plane and vertical to the first direction, and the p-type eighth silicon carbide region contacting the p-type fifth silicon carbide region, the p-type sixth silicon carbide region, and the p-type seventh silicon carbide region; and
a p-type ninth silicon carbide region located in the n-type drift region, the p-type ninth silicon carbide region extending in the second direction, the p-type ninth silicon carbide region contacting the p-type fifth silicon carbide region, the p-type sixth silicon carbide region, and the p-type seventh silicon carbide region, and the p-type ninth silicon carbide region separated from the p-type eighth silicon carbide region.

12. The semiconductor device according to claim 1, further comprising:
a p-type tenth silicon carbide region located between the p-type first silicon carbide region and the p-type body region, the p-type tenth silicon carbide region located between the p-type first silicon carbide region and the n-type second source region, the p-type tenth silicon carbide region contacting the source electrode, a distance between the second plane and the p-type tenth silicon carbide region being smaller than a distance between the second plane and the first gate electrode, and the p-type tenth silicon carbide region having a p-type impurity concentration higher than a p-type impurity concentration of the p-type body region,
wherein the the n-type drift region includes a fifth n-type portion, the fifth n-type portion located between the p-type first silicon carbide region and the p-type tenth silicon carbide region, the fifth n-type portion contacts the source electrode.

13. A semiconductor device comprising:
a silicon carbide layer having a first plane and a second plane;
a source electrode contacting the first plane;
a drain electrode contacting the second plane;
a first gate electrode located between the source electrode and the drain electrode, and the first gate electrode extending in a first direction parallel to the first plane;
a second gate electrode located between the source electrode and the drain electrode, and the second gate electrode extending in the first direction;
an n-type drift region located in the silicon carbide layer, the n-type drift region including a first n-type portion, a second n-type portion, a third n-type portion, and a fourth n-type portion;
a p-type body region located in the silicon carbide layer and located between the n-type drift region and the first plane;
an n-type first source region located in the silicon carbide layer, the n-type first source region located between the p-type body region and the first plane, and the n-type first source region contacting the source electrode;
an n-type second source region located in the silicon carbide layer, the n-type second source region located between the p-type body region and the first plane, the n-type second source region contacting the source electrode, and the first gate electrode being located between the n-type first source region and the n-type second source region;
a p-type first silicon carbide region located in the silicon carbide layer, the p-type first silicon carbide region located between the n-type drift region and the first plane, the p-type first silicon carbide region contacting the source electrode, a distance between the second plane and the p-type first silicon carbide region being smaller than a distance between the second plane and the first gate electrode, the first gate electrode being located between the n-type first source region and the p-type first silicon carbide region, the p-type first silicon carbide region located between the first gate electrode and the p-type body region, and the p-type first silicon carbide region having a p-type impurity concentration higher than a p-type impurity concentration of the p-type body region;
a p-type second silicon carbide region located in the silicon carbide layer, the p-type second silicon carbide region located between the n-type drift region and the first plane, the p-type second silicon carbide region contacting the source electrode, a distance between the second plane and the p-type second silicon carbide region being smaller than a distance between the second plane and the second gate electrode, the second gate electrode being located between the n-type second source region and the p-type second silicon carbide region, the p-type second silicon carbide region located between the second gate electrode and the p-type body region, and the p-type second silicon carbide region having a p-type impurity concentration higher than the p-type impurity concentration of the p-type body region;

a first gate insulating layer located between the first gate electrode and the n-type drift region, between the first gate electrode and the p-type body region, between the first gate electrode and the p-type first silicon carbide region, and between the first gate electrode and the n-type first source region;

a second gate insulating layer located between the second gate electrode and the n-type drift region, between the second gate electrode and the p-type body region, between the second gate electrode and the p-type second silicon carbide region, and between the second gate electrode and the n-type second source region;

a p-type third silicon carbide region located in the silicon carbide layer, the p-type third silicon carbide region extending in a second direction parallel to the first plane and vertical to the first direction, the p-type third silicon carbide region located between the second plane and the first gate electrode, the p-type third silicon carbide region located between the second plane and the second gate electrode, the p-type third silicon carbide region contacting the p-type first silicon carbide region and the p-type second silicon carbide region, the first n-type portion being located between the first gate insulating layer and the p-type third silicon carbide region, and the second n-type portion being located between the second gate insulating layer and the p-type third silicon carbide region; and a p-type fourth silicon carbide region located in the silicon carbide layer, the p-type fourth silicon carbide region extending in the second direction, the p-type fourth silicon carbide region located between the second plane and the first gate electrode, the p-type fourth silicon carbide region located between the second plane and the second gate electrode, the p-type fourth silicon carbide region contacting the first silicon carbide region and the second silicon carbide region, the third n-type portion being located between the first gate insulating layer and the p-type fourth silicon carbide region, the fourth n-type portion being located between the second gate insulating layer and the p-type fourth silicon carbide region, and the p-type fourth silicon carbide region separated from the p-type third silicon carbide region.

14. The semiconductor device according to claim 13, wherein a distance between the p-type third silicon carbide region and the first gate insulating layer and a distance between the p-type third silicon carbide region and the second gate insulating layer are 0.05 µm to 0.2 µm.

15. The semiconductor device according to claim 13, wherein the n-type drift region has a first n-type region and a second n-type region located between the first n-type region and the p-type body region, the second n-type region having an n-type impurity concentration higher than an n-type impurity concentration of the first n-type region, and the first n-type portion and the second n-type portion are located in the second n-type region.

16. The semiconductor device according to claim 15, wherein the n-type impurity concentration of the second n-type region is $2\times10^{17}$ cm$^{-3}$ to $1\times10^{19}$ cm$^{-3}$.

17. An inverter circuit comprising the semiconductor device according to claim 1.

18. A drive device comprising the semiconductor device according to claim 1.

19. A vehicle comprising the semiconductor device according to claim 1.

20. An elevator comprising the semiconductor device according to claim 1.

* * * * *